United States Patent [19]
Prohofsky

[11] Patent Number: 5,745,508
[45] Date of Patent: Apr. 28, 1998

[54] ERROR-DETECTION CODE

[75] Inventor: Thomas Roy Prohofsky, Bloomington, Minn.

[73] Assignee: Tricord Systems, Inc., Plymouth, Minn.

[21] Appl. No.: 556,335

[22] Filed: Nov. 13, 1995

[51] Int. Cl.[6] ...................................................... G06F 11/10
[52] U.S. Cl. ........................................................ 371/40.1
[58] Field of Search ............................................. 371/40.1

[56] References Cited

U.S. PATENT DOCUMENTS

| | | | |
|---|---|---|---|
| 5,206,865 | 4/1993 | Gruender, Jr. et al. | 371/40.1 |
| 5,291,498 | 3/1994 | Jackson et al. | 371/40.1 |
| 5,369,650 | 11/1994 | Kirk et al. | 371/40.1 |
| 5,450,423 | 9/1995 | Iwasaki et al. | 371/40.1 |
| 5,481,552 | 1/1996 | Alderguia et al. | 371/40.1 |
| 5,490,155 | 2/1996 | Abdoo et al. | 371/40.1 |

OTHER PUBLICATIONS

"64–Bit Flow–Thru Error Detection and Correction Unit", *Integrated Device Technology, Inc., Preliminary IDT49C466*, 1–11, (Jun., 1991).

*Primary Examiner*—Stephen M. Baker
*Attorney, Agent, or Firm*—Schwegman, Lundberg, Woessner & Kluth, P.A.

[57] ABSTRACT

Method and apparatus for improved detection of multiple-bit errors which occur within a single memory circuits. In one embodiment, a computer system is described which includes a main computer and a memory system. The memory system includes a plurality of memory circuits, at least one of the plurality of memory circuits having a data interface more than two bits wide. Also included is a multiple-bit-error-detect (MBED) circuit, wherein bits from the plurality of memory circuits are coupled to the MBED circuit in an order which causes the MBED circuit to preferentially detect multiple-bit errors which occur on the data interface of any single one of the plurality of memory circuits. In another embodiment, the method comprises the steps of: a) providing an initial bit-connection order between the plurality of memory circuits and the error-detection circuit; b) testing each of the predetermined set of possible multi-bit error conditions; c) determining whether the error-detection circuit provides (1) an erroneous no-error/single-bit-error indication or (2) a non-erroneous multiple-bit-error indication for each one of the predetermined set of possible multi-bit error conditions; and d) based on a number of erroneous indications or non-erroneous indications determined in step c), either: re-ordering the bit-connection order and reexecuting step b), or providing the bit-connection order as an output. In one such embodiment this method is used wherein the step of re-ordering comprises the step of shifting at least one bit connection from the first memory circuit to the second memory circuit.

19 Claims, 20 Drawing Sheets

| SYSTEM BUS ADDRESS BITS | | | | | | | | | | | | |
|---|---|---|---|---|---|---|---|---|---|---|---|---|
| 31 | 30 | 29 | 28 | 27 | 26 | 25 | 24 | 23 — 14 | 13 — 4 | 3 — 0 | |
| | | | | | | COL | ROW ADRS | COL ADRS | 0 | 1M x 128 BANK |
| | | | | COL | ROW ADRS | COL ADRS | 0 | 4M x 128 BANK |
| | | | COL | ROW ADRS | COL ADRS | 0 | 16M x 128 BANK |
| | | COL | ROW ADRS | COL ADRS | 0 | 64M x 128 BANK |

FIG. 5

| BANK SIZE | 1M x 128 | 4M x 128 | 16M x 128 | 64M x 128 |
|---|---|---|---|---|
| 00000000 – 0009FFFF | 640K CONVENTIONAL DRAM | | | |
| 000A0000 – 000BFFFF | 128K GRAPHICS OR SHADOW DRAM | | | |
| 000C0000 – 000DFFFF | 128K BIOS OR SHADOW DRAM | | | |
| 000E0000 – 000FFFFF | 128K BIOS OR SHADOW DRAM | | | |
| 00FFFFFF | END OF 16M BANK 0 | | | |
| 01000000 – 01FFFFFF | 16M BANK 1 | | | |
| 02000000 – 02FFFFFF | 16M BANK 2 | | | |
| 03000000 – 03FFFFFF | 16M BANK 3 | END OF 64M BANK 0 | | |
| 04000000 – 07FFFFFF | | 64M BANK 1 | | |
| 08000000 – 0BFFFFFF | | 64M BANK 2 | | |
| 0C000000 – 0FFFFFFF | | 64M BANK 3 | END OF 256M BANK 0 | |
| 10000000 – 1FFFFFFF | | | 256M BANK 1 | |
| 20000000 – 2FFFFFFF | | | 256M BANK 2 | |
| 30000000 – 3FFFFFFF | | | 256M BANK 3 | END OF 1G BANK 0 |
| 40000000 – 7FFFFFFF | | | | 1G BANK 1 |
| 80000000 – BFFFFFFF | | | | 1G BANK 2 |
| C0000000 – F7FFFFFF | | | | 1G BANK 3 |
| F8000000 – FFFFFFFF | | | | |

FIG. 6

SCRUB

DATA FOR SCRUB TESTING CONSISTS OF FOUR WORD GROUPS. WITHIN EACH GROUP IS ONE SINGLE BIT ERROR WORD, ONE DOUBLE BIT ERROR WORD, AND TWO ERROR FREE WORDS. AFTER SCRUB HAS PASSED THROUGH THE GROUP, THE ERROR LOG SHOULD CONTAIN THE SINGLE BIT ERROR ENTRY. SUBSEQUENT READ OF DRAM SHOULD VERIFY THAT THE SINGLE BIT ERROR WORD WAS CORRECTED AND THE OTHER THREE WERE NOT MODIFIED. THE PURPOSE OF THESE TESTS ARE NOT TO CHECK INDIVIDUAL BITS BUT RATHER THE SCRUB CORRECTION MECHANISM. THEREFORE THE SAME DATA GROUP IS USED AT DIFFERENT ADDRESS RANGES.

| ADDRESS | DATA WORD | CHECKBITS ORIGINAL | CHECKBITS MODIFIED | BIT IN ERROR | TIME TO CORRECT |
|---|---|---|---|---|---|
| 0x00004000 | 0x0000000000000000 | 0x0C | -- | NONE | |
| 0x00008000 | 0x0000000000000003 | 0x09 | 0xDA | 2 | |
| 0x0000C000 | 0x0000000000000005 | 0x11 | 0x09 | MULTIPLE | |
| 0x00010000 | 0x0000000012345678 | -- | -- | NONE | 65 us |

THE ABOVE DATA BLOCK IS TESTED AT VARIOUS ADDRESS RANGES. THE TIME FOR SCRUB TO PASS THROUGH VARIOUS AREAS IS SHOWN:

0x00100000, 0x00104000, 0x00108000, 0x0010C000        1 MILLISECOND
0x01000000, 0x01004000, 0x01008000, 0x0100C000        16 ms
0x10000000, 0x10004000, 0x10008000, 0x1000C000        256 ms
0x100000000, 0x100004000, 0x100008000, 0x10000C000    1 SECOND

A DATA BOCK MAY ALSO BE INSERTED AND SCRUB LEFT OFF TO VERIFY THE CAPABILITY OF DISABLING SCRUB.

FIG. 7

| GENERATED CHECKBITS | PARITY | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| CB0 | EVEN |   | X | X | X |   | X |   |   | X | X |   | X |   |   | X |   |
| CB1 | EVEN | X | X | X |   | X |   | X |   | X |   | X |   | X |   |   |   |
| CB2 | ODD  | X |   |   | X | X |   |   | X |   | X | X |   |   | X |   | X |
| CB3 | ODD  | X | X |   |   |   | X | X | X |   |   |   | X | X | X |   |   |
| CB4 | EVEN |   |   |   | X | X | X | X | X |   |   |   |   |   |   | X | X |
| CB5 | EVEN |   |   |   |   |   |   |   |   | X | X | X | X | X | X | X | X |
| CB6 | EVEN | X | X | X | X | X | X | X | X |   |   |   |   |   |   |   |   |
| CB7 | EVEN | X | X | X | X | X | X | X | X |   |   |   |   |   |   |   |   |

| GENERATED CHECKBITS | PARITY | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|
| CB0 | EVEN |   | X | X | X |   | X |   |   | X | X |   | X |   |   | X |   |
| CB1 | EVEN | X | X | X |   | X |   | X |   | X |   | X |   | X |   |   |   |
| CB2 | ODD  | X |   |   | X | X |   |   | X |   | X | X |   |   | X |   | X |
| CB3 | ODD  | X | X |   |   |   | X | X | X |   |   |   | X | X | X |   |   |
| CB4 | EVEN |   |   |   | X | X | X | X | X |   |   |   |   |   |   | X | X |
| CB5 | EVEN |   |   |   |   |   |   |   |   | X | X | X | X | X | X | X | X |
| CB6 | EVEN |   |   |   |   |   |   |   |   | X | X | X | X | X | X | X | X |
| CB7 | EVEN |   |   |   |   |   |   |   |   | X | X | X | X | X | X | X | X |

| GENERATED CHECKBITS | PARITY | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|---|
| CB0 | EVEN | X |   |   | X |   | X | X |   |   | X |   | X | X |   |   | X |
| CB1 | EVEN | X | X | X |   | X |   | X |   | X |   | X |   | X |   |   |   |
| CB2 | ODD  | X |   |   | X | X |   |   | X |   | X | X |   |   | X |   | X |
| CB3 | ODD  | X | X |   |   |   | X | X | X |   |   |   | X | X | X |   |   |
| CB4 | EVEN |   |   | X | X | X | X | X |   |   |   |   |   |   |   | X | X |
| CB5 | EVEN |   |   |   |   |   |   |   |   | X | X | X | X | X | X | X | X |
| CB6 | EVEN | X | X | X | X | X | X | X | X |   |   |   |   |   |   |   |   |
| CB7 | EVEN |   |   |   |   |   |   |   |   | X | X | X | X | X | X | X | X |

| GENERATED CHECKBITS | PARITY | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|---|
| CB0 | EVEN | X |   |   | X |   | X | X |   |   | X |   | X | X |   |   | X |
| CB1 | EVEN | X | X | X |   | X |   | X |   | X |   | X |   | X |   |   |   |
| CB2 | ODD  | X |   |   | X | X |   |   | X |   | X | X |   |   | X |   | X |
| CB3 | ODD  | X | X |   |   |   | X | X | X |   |   |   | X | X | X |   |   |
| CB4 | EVEN |   |   | X | X | X | X | X |   |   |   |   |   |   |   | X | X |
| CB5 | EVEN |   |   |   |   |   |   |   |   | X | X | X | X | X | X | X | X |
| CB6 | EVEN |   |   |   |   |   |   |   |   | X | X | X | X | X | X | X | X |
| CB7 | EVEN | X | X | X | X | X | X | X | X |   |   |   |   |   |   |   |   |

FIG. 8

|   | | | 0 | 1 | 2 | 3 | 4 | 5 | 6 | 7 | 8 | 9 | A | B | C | D | E | F |
|---|---|---|---|---|---|---|---|---|---|---|---|---|---|---|---|---|---|---|
| SYNDROME | | S7 | 0 | 0 | 0 | 0 | 0 | 0 | 0 | 0 | 1 | 1 | 1 | 1 | 1 | 1 | 1 | 1 |
| BITS | | S6 | 0 | 0 | 0 | 0 | 1 | 1 | 1 | 1 | 0 | 0 | 0 | 0 | 1 | 1 | 1 | 1 |
| | | S5 | 0 | 0 | 1 | 1 | 0 | 0 | 1 | 1 | 0 | 0 | 1 | 1 | 0 | 0 | 1 | 1 |
| S3 S2 S1 S0 | | S4 | 0 | 1 | 0 | 1 | 0 | 1 | 0 | 1 | 0 | 1 | 0 | 1 | 0 | 1 | 0 | 1 |
| 0 | 0 0 0 0 | | * | C4 | C5 | T | C6 | T | T | 62 | C7 | T | T | 46 | T | M | M | T |
| 1 | 0 0 0 1 | | C0 | T | T | 14 | T | M | M | T | T | M | M | T | M | T | T | 30 |
| 2 | 0 0 1 0 | | C1 | T | T | M | T | 34 | 56 | T | T | 50 | 40 | T | M | T | T | M |
| 3 | 0 0 1 1 | | T | 18 | 8 | T | M | T | T | M | M | T | T | M | T | 2 | 24 | T |
| 4 | 0 1 0 0 | | C2 | T | T | 15 | T | 35 | 57 | T | T | 51 | 41 | T | M | T | T | 31 |
| 5 | 0 1 0 1 | | T | 19 | 9 | T | M | T | T | 63 | M | T | T | 47 | T | 3 | 25 | T |
| 6 | 0 1 1 0 | | T | 20 | 10 | T | M | T | T | M | M | T | T | M | T | 4 | 26 | T |
| 7 | 0 1 1 1 | | M | T | T | M | T | 36 | 58 | T | T | 52 | 42 | T | M | T | T | M |
| 8 | 1 0 0 0 | | C3 | T | T | M | T | 37 | 59 | T | T | 53 | 43 | T | M | T | T | M |
| 9 | 1 0 0 1 | | T | 21 | 11 | T | M | T | T | M | M | T | T | M | T | 5 | 27 | T |
| A | 1 0 1 0 | | T | 22 | 12 | T | 33 | T | T | M | 49 | T | T | M | T | 6 | 28 | T |
| B | 1 0 1 1 | | 17 | T | T | M | T | 38 | 60 | T | T | 54 | 44 | T | 1 | T | T | M |
| C | 1 1 0 0 | | T | 23 | 13 | T | M | T | T | M | M | T | T | M | T | 7 | 29 | T |
| D | 1 1 0 1 | | M | T | T | M | T | 39 | 61 | T | T | 55 | 45 | T | M | T | T | M |
| E | 1 1 1 0 | | 16 | T | T | M | T | M | M | T | T | M | M | T | 0 | T | T | M |
| F | 1 1 1 1 | | T | M | M | T | 32 | T | T | M | 48 | T | T | M | T | M | M | T |

NOTES:
* NO ERRORS DETECTED
\# BIT NUMBER OF SINGLE BIT ERROR
T TWO BIT ERRORS DETECTED
M MULTI BIT ERROR (> 2) DETECTED
C# BIT NUMBER OF SINGLE CHECKBIT ERROR

FIG. 9

THE FOLLOWING TABLE PRESENTS ONE SET OF 64 BIT DATA WORDS THAT WILL GENERATE ALL 256 CHECKBIT PATTERNS WHEN WRITTEN TO DRAM. SINCE THIS IS ONLY ONE SET OUT OF MANY (MILLIONS), FAULT COVERAGE OF THE PARITY GENERATION TREE IS NOT 100%, HOWEVER, EACH FINAL CHECKBIT OUTPUT IS TOGGLED.

| CHECK BITS | DATA WORD | CHECK BITS | DATA WORD | CHECK BITS | DATA WORD |
|---|---|---|---|---|---|
| 0 | 0000000000271800 | 40 | 0000000100001800 | 80 | 0000000010011801 |
| 1 | 0000000000011800 | 41 | 0000000100261800 | 81 | 0000000100271801 |
| 2 | 0000000000010000 | 42 | 0000000100260000 | 82 | 0000000100270001 |
| 3 | 0000000000270000 | 43 | 0000000100010000 | 83 | 0000000100010001 |
| 4 | 0000000000010300 | 44 | 0000000100260300 | 84 | 0000000100270301 |
| 5 | 0000000000270300 | 45 | 0000000100000300 | 85 | 0000000100010301 |
| 6 | 0000000000271B00 | 46 | 0000000100001B00 | 86 | 0000000100011B01 |
| 7 | 0000000000011B00 | 47 | 0000000100261B00 | 87 | 0000000100271B01 |
| 8 | 0000000000261B00 | 48 | 0000000100011B00 | 88 | 0000000100001B01 |
| 9 | 0000000000001B00 | 49 | 0000000100271B00 | 89 | 0000000100261B01 |
| A | 0000000000000300 | 4A | 0000000100270300 | 8A | 0000000100260301 |
| B | 0000000000260300 | 4B | 0000000100010300 | 8B | 0000000100000301 |
| C | 0000000000000000 | 4C | 0000000100270000 | 8C | 0000000100260001 |
| D | 0000000000260000 | 4D | 0000000100010000 | 8D | 0000000100000001 |
| E | 0000000000261800 | 4E | 0000000100011800 | 8E | 0000000100001801 |
| F | 0000000000001800 | 4F | 0000000100271800 | 8F | 0000000100261801 |
| 10 | 0000000000800000 | 50 | 0000000100A70000 | 90 | 0000000100A60001 |
| 11 | 0000000000A60000 | 51 | 0000000100810000 | 91 | 0000000100800001 |
| 12 | 0000000000A61800 | 52 | 0000000100811800 | 92 | 0000000100801801 |
| 13 | 0000000000801800 | 53 | 0000000100A71800 | 93 | 0000000100A61801 |
| 14 | 0000000000A61B00 | 54 | 0000000100811B00 | 94 | 0000000100801B01 |

| CHECK BITS | DATA WORD |
|---|---|
| C0 | 0000000000261801 |
| C1 | 0000000000001801 |
| C2 | 0000000000000001 |
| C3 | 0000000000260001 |
| C4 | 0000000000000301 |
| C5 | 0000000000260301 |
| C6 | 0000000000261B01 |
| C7 | 0000000000001B01 |
| C8 | 0000000000271B01 |
| C9 | 0000000000011B01 |
| CA | 0000000000010301 |
| CB | 0000000000270301 |
| CC | 0000000000010001 |
| CD | 0000000000270001 |
| CE | 0000000000271801 |
| CF | 0000000000011801 |
| D0 | 0000000000810001 |
| D1 | 0000000000A70001 |
| D2 | 0000000000A71801 |
| D3 | 0000000000811801 |
| D4 | 0000000000A71B01 |

FIG. 10A

| CHECK BITS | DATA WORD | CHECK BITS | DATA WORD | CHECK BITS | DATA WORD |
|---|---|---|---|---|---|
| 15 | 00000000000801B00 | 55 | 0000000100A71B00 | 95 | 0000000100A61B01 | D5 | 00000000000811B01 |
| 16 | 00000000000800300 | 56 | 0000000100A70300 | 96 | 0000000100A60301 | D6 | 00000000000810301 |
| 17 | 00000000000A60300 | 57 | 0000000100810300 | 97 | 0000000100800301 | D7 | 00000000000A70301 |
| 18 | 00000000000810300 | 58 | 0000000100A60300 | 98 | 0000000100A70301 | D8 | 00000000000800301 |
| 19 | 00000000000A70300 | 59 | 0000000100800300 | 99 | 0000000100810301 | D9 | 00000000000A60301 |
| 1A | 00000000000A71B00 | 5A | 0000000100801B00 | 9A | 0000000100811B01 | DA | 00000000000A61B01 |
| 1B | 00000000000811B00 | 5B | 0000000100A61B00 | 9B | 0000000100A71B01 | DB | 00000000000801B01 |
| 1C | 00000000000A71800 | 5C | 0000000100801800 | 9C | 0000000100811801 | DC | 00000000000A61801 |
| 1D | 00000000000811800 | 5D | 0000000100A61800 | 9D | 0000000100A71801 | DD | 00000000000801801 |
| 1E | 00000000000810000 | 5E | 0000000100A60000 | 9E | 0000000100A70001 | DE | 00000000000800001 |
| 1F | 00000000000A70000 | 5F | 0000000100800000 | 9F | 0000000100810001 | DF | 00000000000A60001 |
| 20 | 00000000000A69B00 | 60 | 0000000100819B00 | A0 | 0000000100809B01 | E0 | 00000000000A79B01 |
| 21 | 00000000000809B00 | 61 | 0000000100A79B00 | A1 | 0000000100A69B01 | E1 | 00000000000819B01 |
| 22 | 00000000000808300 | 62 | 0000000100A78300 | A2 | 0000000100A68301 | E2 | 00000000000818301 |
| 23 | 00000000000A68300 | 63 | 0000000100818300 | A3 | 0000000100808301 | E3 | 00000000000A78301 |
| 24 | 00000000000808000 | 64 | 0000000100A78000 | A4 | 0000000100A68001 | E4 | 00000000000818001 |
| 25 | 00000000000A68000 | 65 | 0000000100818000 | A5 | 0000000100808001 | E5 | 00000000000A78001 |
| 26 | 00000000000A69800 | 66 | 0000000100819800 | A6 | 0000000100809801 | E6 | 00000000000A79801 |
| 27 | 00000000000809800 | 67 | 0000000100A79800 | A7 | 0000000100A69801 | E7 | 00000000000819801 |
| 28 | 00000000000A79800 | 68 | 0000000100819800 | A8 | 0000000100819801 | E8 | 00000000000A69801 |
| 29 | 00000000000819800 | 69 | 0000000100A69800 | A9 | 0000000100A79801 | E9 | 00000000000809801 |

FIG. 10B

| CHECK BITS | DATA WORD | CHECK BITS | DATA WORD | CHECK BITS | DATA WORD | CHECK BITS | DATA WORD |
|---|---|---|---|---|---|---|---|
| 2A | 00000000008180C0 | 6A | 0000000100A68000 | AA | 0000000100A78001 | EA | 0000000000808001 |
| 2B | 0000000000A78000 | 6B | 0000000100808000 | AB | 0000000100818001 | EB | 0000000000A68001 |
| 2C | 0000000000818300 | 6C | 0000000100A68300 | AC | 0000000100A78301 | EC | 0000000000808301 |
| 2D | 0000000000A78300 | 6D | 0000000100808300 | AD | 0000000100818301 | ED | 0000000000A68301 |
| 2E | 0000000000A79B00 | 6E | 0000000100809B00 | AE | 0000000100819B01 | EE | 0000000000A69B01 |
| 2F | 0000000000819B00 | 6F | 0000000100A69B00 | AF | 0000000100A79B01 | EF | 0000000000 809B01 |
| 30 | 0000000000018300 | 70 | 0000000100268300 | B0 | 0000000100278301 | F0 | 0000000000008301 |
| 31 | 0000000000278300 | 71 | 0000000100008300 | B1 | 0000000100018301 | F1 | 0000000000268301 |
| 32 | 0000000000279B00 | 72 | 0000000100009B00 | B2 | 0000000100019B01 | F2 | 0000000000269B01 |
| 33 | 0000000000019B00 | 73 | 0000000100269B00 | B3 | 0000000100279B01 | F3 | 0000000000009B01 |
| 34 | 0000000000279800 | 74 | 0000000100009800 | B4 | 0000000100019801 | F4 | 0000000000269801 |
| 35 | 0000000000019800 | 75 | 0000000100269800 | B5 | 0000000100279801 | F5 | 0000000000009801 |
| 36 | 0000000000018000 | 76 | 0000000100268000 | B6 | 0000000100278001 | F6 | 0000000000008001 |
| 37 | 0000000000278000 | 77 | 0000000100008000 | B7 | 0000000100018001 | F7 | 0000000000268001 |
| 38 | 00000000000080C0 | 78 | 0000000100278000 | B8 | 0000000100268001 | F8 | 0000000000018001 |
| 39 | 0000000000268000 | 79 | 0000000100018000 | B9 | 0000000100008001 | F9 | 0000000000278001 |
| 3A | 0000000000269800 | 7A | 0000000100019800 | BA | 0000000100009801 | FA | 0000000000279801 |
| 3B | 0000000000009800 | 7B | 0000000100279800 | BB | 0000000100269801 | FB | 0000000000019801 |
| 3C | 0000000000269B00 | 7C | 0000000100019B00 | BC | 0000000100009B01 | FC | 0000000000279B01 |
| 3D | 0000000000009B00 | 7D | 0000000100279B00 | BD | 0000000100269B01 | FD | 0000000000019B01 |
| 3E | 0000000000008300 | 7E | 0000000100278300 | BE | 0000000100268301 | FE | 0000000000018301 |
| 3F | 0000000000268300 | 7F | 0000000100018300 | BF | 0000000100008301 | FF | 0000000000278301 |

FIG. 10C

| DATA WORD | CHECKBITS ORIGINAL | CHECKBITS MODIFIED | BIT IN ERROR | ERROR LOG SYNDROME |
|---|---|---|---|---|
| 0×0000000000000000 | 0×0C | 0×C2 | 0 | 0×CE |
| 0×0000000000000000 | 0×0C | 0×C7 | 1 | 0×CB |
| 0×0000000000000000 | 0×0C | 0×DF | 2 | 0×D3 |
| 0×0000000000000000 | 0×0C | 0×D9 | 3 | 0×D5 |
| 0×0000000000000000 | 0×0C | 0×DA | 4 | 0×D6 |
| 0×0000000000000000 | 0×0C | 0×D5 | 5 | 0×D9 |
| 0×0000000000000000 | 0×0C | 0×D6 | 6 | 0×DA |
| 0×0000000000000000 | 0×0C | 0×D0 | 7 | 0×DC |
| 0×0000000000000000 | 0×0C | 0×2F | 8 | 0×23 |
| 0×0000000000000000 | 0×0C | 0×29 | 9 | 0×25 |
| 0×0000000000000000 | 0×0C | 0×2A | 10 | 0×26 |
| 0×0000000000000000 | 0×0C | 0×25 | 11 | 0×29 |
| 0×0000000000000000 | 0×0C | 0×26 | 12 | 0×2A |
| 0×0000000000000000 | 0×0C | 0×20 | 13 | 0×2C |
| 0×0000000000000000 | 0×0C | 0×3D | 14 | 0×31 |
| 0×0000000000000000 | 0×0C | 0×38 | 15 | 0×34 |
| 0×0000000000000000 | 0×0C | 0×02 | 16 | 0×0E |
| 0×0000000000000000 | 0×0C | 0×07 | 17 | 0×0B |
| 0×0000000000000000 | 0×0C | 0×1F | 18 | 0×13 |
| 0×0000000000000000 | 0×0C | 0×19 | 19 | 0×15 |
| 0×0000000000000000 | 0×0C | 0×1A | 20 | 0×16 |
| 0×0000000000000000 | 0×0C | 0×15 | 21 | 0×19 |
| 0×0000000000000000 | 0×0C | 0×16 | 22 | 0×1A |
| 0×0000000000000000 | 0×0C | 0×10 | 23 | 0×1C |
| 0×0000000000000000 | 0×0C | 0×EF | 24 | 0×E3 |
| 0×0000000000000000 | 0×0C | 0×E9 | 25 | 0×E5 |
| 0×0000000000000000 | 0×0C | 0×EA | 26 | 0×E6 |
| 0×0000000000000000 | 0×0C | 0×E5 | 27 | 0×E9 |
| 0×0000000000000000 | 0×0C | 0×E6 | 28 | 0×EA |
| 0×0000000000000000 | 0×0C | 0×E0 | 29 | 0×EC |
| 0×0000000000000000 | 0×0C | 0×FD | 30 | 0×F1 |
| 0×0000000000000000 | 0×0C | 0×F8 | 31 | 0×F4 |

FIG. 11A

| DATA WORD | CHECKBITS ORIGINAL | CHECKBITS MODIFIED | BIT IN ERROR | ERROR LOG SYNDROME |
|---|---|---|---|---|
| 0×0000000000000000 | 0×0C | 0×43 | 32 | 0×4F |
| 0×0000000000000000 | 0×0C | 0×46 | 33 | 0×4A |
| 0×0000000000000000 | 0×0C | 0×5E | 34 | 0×52 |
| 0×0000000000000000 | 0×0C | 0×58 | 35 | 0×54 |
| 0×0000000000000000 | 0×0C | 0×5B | 36 | 0×57 |
| 0×0000000000000000 | 0×0C | 0×54 | 37 | 0×58 |
| 0×0000000000000000 | 0×0C | 0×57 | 38 | 0×5B |
| 0×0000000000000000 | 0×0C | 0×51 | 39 | 0×5D |
| 0×0000000000000000 | 0×0C | 0×AE | 40 | 0×A2 |
| 0×0000000000000000 | 0×0C | 0×A8 | 41 | 0×A4 |
| 0×0000000000000000 | 0×0C | 0×AB | 42 | 0×A7 |
| 0×0000000000000000 | 0×0C | 0×A4 | 43 | 0×A8 |
| 0×0000000000000000 | 0×0C | 0×A7 | 44 | 0×AB |
| 0×0000000000000000 | 0×0C | 0×A1 | 45 | 0×AD |
| 0×0000000000000000 | 0×0C | 0×BC | 46 | 0×B0 |
| 0×0000000000000000 | 0×0C | 0×B9 | 47 | 0×B5 |
| 0×0000000000000000 | 0×0C | 0×83 | 48 | 0×8F |
| 0×0000000000000000 | 0×0C | 0×86 | 49 | 0×8A |
| 0×0000000000000000 | 0×0C | 0×9E | 50 | 0×92 |
| 0×0000000000000000 | 0×0C | 0×98 | 51 | 0×94 |
| 0×0000000000000000 | 0×0C | 0×9B | 52 | 0×97 |
| 0×0000000000000000 | 0×0C | 0×94 | 53 | 0×98 |
| 0×0000000000000000 | 0×0C | 0×97 | 54 | 0×9B |
| 0×0000000000000000 | 0×0C | 0×91 | 55 | 0×9D |
| 0×0000000000000000 | 0×0C | 0×6E | 56 | 0×62 |
| 0×0000000000000000 | 0×0C | 0×68 | 57 | 0×64 |
| 0×0000000000000000 | 0×0C | 0×6B | 58 | 0×67 |
| 0×0000000000000000 | 0×0C | 0×64 | 59 | 0×68 |
| 0×0000000000000000 | 0×0C | 0×67 | 60 | 0×6B |
| 0×0000000000000000 | 0×0C | 0×61 | 61 | 0×6D |
| 0×0000000000000000 | 0×0C | 0×7C | 62 | 0×70 |
| 0×0000000000000000 | 0×0C | 0×79 | 63 | 0×75 |

FIG. 11B

| DATA WORD | CHECKBITS ORIGINAL | CHECKBITS MODIFIED | BIT IN ERROR | ERROR LOG SYNDROME |
|---|---|---|---|---|
| 0×0000000000271800 | 0×00 | 0×01 | CB0 | 0×01 |
| 0×0000000000271800 | 0×00 | 0×02 | CB1 | 0×02 |
| 0×0000000000271800 | 0×00 | 0×04 | CB2 | 0×04 |
| 0×0000000000271800 | 0×00 | 0×08 | CB3 | 0×08 |
| 0×0000000000271800 | 0×00 | 0×10 | CB4 | 0×10 |
| 0×0000000000271800 | 0×00 | 0×20 | CB5 | 0×20 |
| 0×0000000000271800 | 0×00 | 0×40 | CB6 | 0×40 |
| 0×0000000000271800 | 0×00 | 0×80 | CB7 | 0×80 |
| 0×0000000000000000 | 0×0C | 0×00 | ALL ZEROS CASE – MULTI BIT | |
| 0×FFFFFFFFFFFFFFFF | 0×0C | 0×FF | ALL ONES CASE – MULTI BIT | |
| 0×0000000000000000 | 0×0C | 0×09 | MULTIPLE BIT | |
| 0×0000000000000000 | 0×0C | 0×11 | MULTIPLE BIT | |
| 0×0000000000000000 | 0×0C | 0×17 | MULTIPLE BIT | |
| 0×0000000000000000 | 0×0C | 0×12 | MULTIPLE BIT | |
| 0×0000000000000000 | 0×0C | 0×0A | MULTIPLE BIT | |
| 0×0000000000000000 | 0×0C | 0×1B | MULTIPLE BIT | |
| 0×0000000000000000 | 0×0C | 0×1E | MULTIPLE BIT | |
| 0×0000000000000000 | 0×0C | 0×06 | MULTIPLE BIT | |
| 0×0000000000000000 | 0×0C | 0×CC | MULTIPLE BIT | |
| 0×0000000000000000 | 0×0C | 0×C9 | MULTIPLE BIT | |
| 0×0000000000000000 | 0×0C | 0×D1 | MULTIPLE BIT | |
| 0×0000000000000000 | 0×0C | 0×D7 | MULTIPLE BIT | |
| 0×0000000000000000 | 0×0C | 0×DB | MULTIPLE BIT | |
| 0×0000000000000000 | 0×0C | 0×21 | MULTIPLE BIT | |
| 0×0000000000000000 | 0×0C | 0×E1 | MULTIPLE BIT | |
| 0×0000000000000000 | 0×0C | 0×E4 | MULTIPLE BIT | |
| 0×0000000000000000 | 0×0C | 0×FC | MULTIPLE BIT | |
| 0×0000000000000000 | 0×0C | 0×FA | MULTIPLE BIT | |
| 0×0000000000000000 | 0×0C | 0×F6 | MULTIPLE BIT | |

FIG. 11C

LISTED BELOW ARE EIGHT SEQUENTIAL DATA WORD GROUPS THAT GENERATE 128 UNIQUE CHECKBIT WORDS.

| DATA | CHECK-BITS | DATA | CHECK-BITS | DATA | CHECK-BITS | DATA | CHECK-BITS |
|---|---|---|---|---|---|---|---|
| 00000000 | 0C | 00000100 | 2F | 00010000 | 02 | 00010100 | 21 |
| 00000001 | C2 | 00000101 | E1 | 00010001 | CC | 00010101 | EF |
| 00000002 | C7 | 00000102 | E4 | 00010002 | C9 | 00010102 | EA |
| 00000003 | 09 | 00000103 | 2A | 00010003 | 07 | 00010103 | 24 |
| 00000004 | DF | 00000104 | FC | 00010004 | D1 | 00010104 | F2 |
| 00000005 | 11 | 00000105 | 32 | 00010005 | 1F | 00010105 | 3C |
| 00000006 | 14 | 00000106 | 37 | 00010006 | 1A | 00010106 | 39 |
| 00000007 | DA | 00000107 | F9 | 00010007 | D4 | 00010107 | F7 |
| 00000008 | D9 | 00000108 | FA | 00010008 | D7 | 00010108 | F4 |
| 00000009 | 17 | 00000109 | 34 | 00010009 | 19 | 00010109 | 3A |
| 0000000A | 12 | 0000010A | 31 | 0001000A | 1C | 0001010A | 3F |
| 0000000B | DC | 0000010B | FF | 0001000B | D2 | 0001010B | F1 |
| 0000000C | 0A | 0000010C | 29 | 0001000C | 04 | 0001010C | 27 |
| 0000000D | C4 | 0000010D | E7 | 0001000D | CA | 0001010D | E9 |
| 0000000E | C1 | 0000010E | E2 | 0001000E | CF | 0001010E | EC |
| 0000000F | 0F | 0000010F | 2C | 0001000F | 01 | 0001010F | 22 |
| 00000020 | D5 | 00000120 | F6 | 00010020 | DB | 00010120 | F8 |
| 00000021 | 1B | 00000121 | 38 | 00010021 | 15 | 00010121 | 36 |
| 00000022 | 1E | 00000122 | 3D | 00010022 | 10 | 00010122 | 33 |
| 00000023 | D0 | 00000123 | F3 | 00010023 | DE | 00010123 | FD |
| 00000024 | 06 | 00000124 | 25 | 00010024 | 08 | 00010124 | 2B |
| 00000025 | C8 | 00000125 | EB | 00010025 | C6 | 00010125 | E5 |
| 00000026 | CD | 00000126 | EE | 00010026 | C3 | 00010126 | E0 |
| 00000027 | 03 | 00000127 | 20 | 00010027 | 0D | 00010127 | 2E |
| 00000028 | 00 | 00000128 | 23 | 00010028 | 0E | 00010128 | 2D |
| 00000029 | CE | 00000129 | ED | 00010029 | C0 | 00010129 | E3 |
| 0000002A | CB | 0000012A | E8 | 0001002A | C5 | 0001012A | E6 |
| 0000002B | 05 | 0000012B | 26 | 0001002B | 0B | 0001012B | 28 |
| 0000002C | D3 | 0000012C | F0 | 0001002C | DD | 0001012C | FE |
| 0000002D | 1D | 0000012D | 3E | 0001002D | 13 | 0001012D | 30 |
| 0000002E | 18 | 0000012E | 3B | 0001002E | 16 | 0001012E | 35 |
| 0000002F | D6 | 0000012F | F5 | 0001002F | D8 | 0001012F | FB |

FIG. 12

THE FOLLOWING TABLE PRESENTS 65 DATA WORDS WHICH TOGGLE EACH DATA BIT AND THEIR ASSOCIATED CHECKBIT WORDS.

| DATA | CB | DATA | CB | DATA | CB |
|---|---|---|---|---|---|
| 0000000000000000 | 0C | 0000000000008000 | 38 | 0000800000000000 | B9 |
| 0000000000000001 | C2 | 0000000000010000 | 02 | 0001000000000000 | 83 |
| 0000000000000002 | C7 | 0000000000020000 | 07 | 0002000000000000 | 86 |
| 0000000000000004 | DF | 0000000000040000 | 1F | 0004000000000000 | 9E |
| 0000000000000008 | D9 | 0000000000080000 | 19 | 0008000000000000 | 98 |
| 0000000000000010 | DA | 0000000000100000 | 1A | 0010000000000000 | 9B |
| 0000000000000020 | D5 | 0000000000200000 | 15 | 0020000000000000 | 94 |
| 0000000000000040 | D6 | 0000000000400000 | 16 | 0040000000000000 | 97 |
| 0000000000000080 | D0 | 0000000000800000 | 10 | 0080000000000000 | 91 |
| 0000000000000100 | 2F | 0000000001000000 | EF | 0100000000000000 | 6E |
| 0000000000000200 | 29 | 0000000002000000 | E9 | 0200000000000000 | 68 |
| 0000000000000400 | 2A | 0000000004000000 | EA | 0400000000000000 | 6B |
| 0000000000000800 | 25 | 0000000008000000 | E5 | 0800000000000000 | 64 |
| 0000000000001000 | 26 | 0000000010000000 | E6 | 1000000000000000 | 67 |
| 0000000000002000 | 20 | 0000000020000000 | E0 | 2000000000000000 | 61 |
| 0000000000004000 | 3D | 0000000040000000 | FD | 4000000000000000 | 7C |
|  |  |  |  | 8000000000000000 | 79 |

FIG. 13

| MBED BIT MAPPING | | | | | |
|---|---|---|---|---|---|
| IDT49C466 | CHIP # | SIMM DATA BIT | IDT49C466 | CHIP # | SIMM DATA BIT |
| BIT # | | SIMM SLOT J8 | BIT # | | SIMM SLOT J7 |
| md0 | 0 | D0 | md32 | 9 | D0 |
| md15 | 0 | D1 | md44 | 9 | D1 |
| md19 | 0 | D2 | md56 | 9 | D2 |
| cb7 | 0 | D3 | md59 | 9 | D3 |
| md1 | 1 | D4 | md33 | 10 | D4 |
| md4 | 1 | D5 | md51 | 10 | D5 |
| md22 | 1 | D6 | md55 | 10 | D6 |
| md24 | 1 | D7 | cb6 | 10 | D7 |
| md2 | 2 | D8 | md34 | 11 | D8 |
| md17 | 2 | D9 | md53 | 11 | D9 |
| md26 | 2 | D10 | md57 | 11 | D10 |
| cb5 | 2 | D11 | cb1 | 11 | D11 |
| md3 | 3 | D12 | md35 | 12 | D12 |
| md11 | 3 | D13 | md37 | 12 | D13 |
| md16 | 3 | D14 | md46 | 12 | D14 |
| md23 | 3 | D15 | md61 | 12 | D15 |
| md5 | 4 | D16 | md36 | 13 | D16 |
| md9 | 4 | D17 | md38 | 13 | D17 |
| md18 | 4 | D18 | md62 | 13 | D18 |
| md30 | 4 | D19 | cb3 | 13 | D19 |
| md6 | 5 | D20 | md39 | 14 | D20 |
| md13 | 5 | D21 | md48 | 14 | D21 |
| md20 | 5 | D22 | md52 | 14 | D22 |
| cb0 | 5 | D23 | md54 | 14 | D23 |
| md7 | 6 | D24 | md40 | 15 | D24 |
| md25 | 6 | D25 | md41 | 15 | D25 |
| md27 | 6 | D26 | md43 | 15 | D26 |
| md31 | 6 | D27 | md63 | 15 | D27 |
| md8 | 7 | D28 | md42 | 16 | D28 |
| md21 | 7 | D29 | md45 | 16 | D29 |
| md28 | 7 | D30 | md47 | 16 | D30 |
| cb2 | 7 | D31 | md60 | 16 | D31 |
| md10 | 8 | DP0 | md49 | 17 | DP0 |
| md12 | 8 | DP1 | md50 | 17 | DP1 |
| md14 | 8 | DP2 | md58 | 17 | DP2 |
| md29 | 8 | DP3 | cb4 | 17 | DP3 |

FIG. 14

ERROR-DETECTION CODE

FIELD OF THE INVENTION

The present invention relates to methods and apparatus for detecting and correcting errors in computer memories and more specifically to an improved error-detection code and apparatus, and a method for determining same, which are used for detecting single-chip failures in multiple-bit-wide memory circuits.

BACKGROUND OF THE INVENTION

Very fast access to data stored in computer memories along with error detection and correction is desired to enhance the speed of the computer systems which use those memories, while improving reliability and serviceability of the computer systems. Such computer systems include single-processor systems, as well as multiple-processor systems.

The memory subsystems in a computer system can include static random access memories (SRAMs), dynamic random access memories (DRAMs), or dual-ported static random-access memories (DPSRAMs). The memory subsystems commonly include error correction and detection code (ECC) circuits in order to detect and/or potentially correct errors in the data stored in the memory subsystems. Such errors can include errors which may occur, perhaps due to a charged particle or cosmic ray, which causes the data a single cell to change from a logic state zero (hereinafter "zero") to a logic state one (hereinafter "one") or vice versa; errors due to a wire or bit line becoming "stuck" to a one or a zero (such as a short to a high or low data state), regardless of the data which is driven onto that line, or even an entire microcircuit chip failing, with all of its bits, for example, becoming stuck to ones or zeros. Commonly known ECCs have been designed to (1) correct any single-bit error and (2) detect any combination of two bits in error within a group (or "word") of N data bits by adding as few as $\log_2 N$ redundant bits to each word. Such codes are called single-bit-error-correct/double-bit-error-detect (SBEC/DBED) codes. Codes which can detect any three bits in error or any four bits in error do exist, but generally require more redundant bits and/or more complex circuits, methods, or mechanisms, and are generally implemented in more complex circuits.

The prior art includes chips which have been designed to incorporate an entire SBEC/DBED code circuit onto a single integrated circuit chip. Such chips are adequate to handle memory subsystems which include only one-bit- and two-bit-wide memory chips, since even if an entire chip fails, the SBEC/DBED chip will correct (in the case of one-bit-wide memory chips) or at least detect (in the case of two-bit-wide memory chips) any single chip failure.

However, when three-bit-wide or four-bit-wide memory chips are used, a single-chip failure can cause as many as three or four bits at a time to be in error. Prior-art SBEC/DBED chips have not shown how to detect such errors.

SUMMARY OF THE INVENTION

The present invention teaches a method and apparatus for improved detection of multiple-bit errors which occur within a single memory circuits. In one embodiment, a computer system is described which includes a main computer and a memory system. The memory system includes a plurality of memory circuits, at least one of the plurality of memory circuits having a data interface more than two bits wide.

Also included is a multiple-bit-error-detect (MBED) circuit, wherein bits from the plurality of memory circuits are coupled to the MBED circuit in an order which causes the MBED circuit to preferentially detect multiple-bit errors which occur on the data interface of any single one of the plurality of memory circuits.

In one such embodiment, the order that the bits from the plurality of memory circuits are coupled to the MBED circuit is determined by running a test program on a test computer to successively test various orders of coupling bits to the MBED circuit. In one such embodiment, the test program comprises a data structure indicative of error syndromes and related error indications. In another such embodiment, the test program comprises a data structure indicative of which error code (EC) bits are affected by each memory bit of the memory circuits.

In one such embodiment, the MBED circuit is a single-bit-error-correct, two-bit-error-detect (SBEC/DBED) circuit, each of a plurality of the memory circuits have a data interface which is four-bits wide, and bits from the memory interface are coupled to the MBED circuit in an order which causes the MBED circuit to also detect all three-bit and four-bit errors which occur at one time within any single one of the plurality of four-bit-wide memory circuits.

In another embodiment, a method for designing a memory system for a computer system is described. The memory system is capable of detecting multiple-bit errors within each of a plurality of single memory circuits, the computer system having an error-detection circuit capable of detecting multiple-bit errors and generating a plurality of error syndromes, and a memory, the memory having a plurality of memory circuits including a first and a second memory circuit each having a data interface which is more than two bits wide and each connected to the error detection circuit. The method comprises the steps of: a) providing a syndrome data structure distinguishing whether the error-detection circuit provides (1) no-error/single-bit-error indication from (2) a multiple-bit-error indication, as a result of each of the error syndromes; b) providing an error code (EC) data structure indicative of which EC bits are affected by each memory bit of the memory circuits; c) providing an initial bit-connection order between the plurality of memory circuits and the error-detection circuit; d) using a computer program which uses the bit connection order, the syndrome data structure, and the EC data structure, determining whether a first error, having more than two bits wrong within the first memory circuit, would be detected with a multiple-bit-error indication and whether a second error, having more than two bits wrong within the second memory circuit, would be detected with a multiple-bit-error indication; and e) if either the first error or the second error or both are not detected with a multiple-bit-error indication, then re-ordering the bit-connection order and reexecuting step d), otherwise outputing the bit-connection order.

In another embodiment, the method comprises the steps of: a) providing an initial bit-connection order between the plurality of memory circuits and the error-detection circuit; b) testing each of the predetermined set of possible multi-bit error conditions; c) determining whether the error-detection circuit provides (1) an erroneous no-error/single-bit-error indication or (2) a non-erroneous multiple-bit-error indication for each one of the predetermined set of possible multi-bit error conditions; and d) based on a number of erroneous indications or non-erroneous indications determined in step c), either: re-ordering the bit-connection order and reexecuting step b), or providing the bit-connection order as an output. In one such embodiment this method is used wherein the step of re-ordering comprises the step of shifting at least one bit connection from the first memory circuit to the second memory circuit.

BRIEF DESCRIPTION OF THE DRAWINGS

FIG. 5 is an address decoding diagram illustrating details of address decoding used in one embodiment memory subsystem 200.

FIG. 6 is an addressing map for of one embodiment of memory subsystem 200 used in an IBM-compatible-type computer system 100.

FIG. 7 shows the scheme used to scrub memory in one embodiment of memory subsystem 200.

FIG. 8 is a bit map showing which data bits are involved in the eight respective checkbits CB0 through CB7, and the even/odd parity used.

FIG. 9 is a bit map showing which bit or bits are in error for each of the possible 256 syndrome codes for one embodiment of MBED circuit 300.

FIGS. 10A, 10B & 10C show various data patterns which can be used to test generation of each syndrome data pattern.

FIGS. 11A, 11B, & 11C show various checkbit data patterns which can be used to test various error log syndromes.

FIG. 12 shows various checkbit data patterns which can be used to test various error log syndromes.

FIG. 13 shows various data patterns which can be used to test various error log syndromes.

FIG. 14 shows one bit-connection pattern according to the present invention for one SBEC/DBED chip as used in MBED circuit 300.

DESCRIPTION OF THE PREFERRED EMBODIMENT

In the following detailed description of the preferred embodiments, reference is made to the accompanying drawings which form a part hereof, and in which are shown by way of illustration specific exemplary embodiments in which the invention may be practiced. It is to be understood that other embodiments may be utilized and structural changes may be made without departing from the scope of the present invention.

Figure 1:
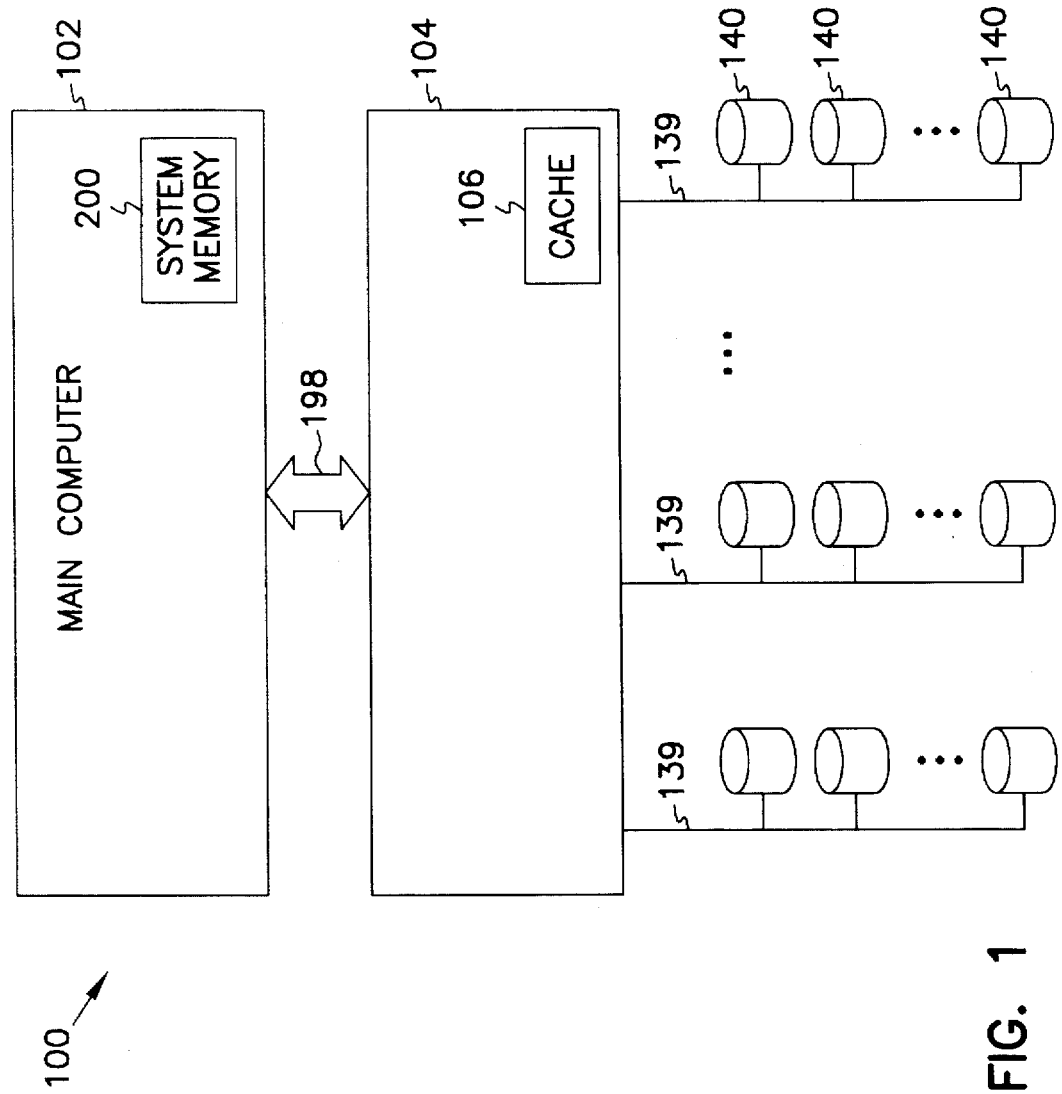
FIG. 1 is a block diagram illustrating an computer system 100 including a memory subsystem 200 according to the present invention.

FIG. 1 is a block diagram illustrating an overall computer system 100 according to the present invention, including main computer 102 and memory system 200 (used as a subsystem in computer system 100 to provide system memory for main computer 102), which in one embodiment, are connected by high-performance external bus 198. Memory system 200 is shown in more detail in FIG. 2.

Main computer 102 also includes disk subsystem 104. A cache 106 and one or more disk-connection busses 139 are provided, each disk-connection bus 139 connected to one or more disk devices 140. In one embodiment, disk-connection busses 139 are standard 16-bit-wide/fast differential-drive SCSI (Small Computer System Interface) busses with differential SCSI terminators, and disk devices 140 are SCSI disk devices. In other embodiments, disk-connection busses 139 are standard 8-bit-wide/fast differential-drive SCSI busses, 8-bit-wide/slow differential-drive SCSI busses, 8-bit-wide/fast single-ended-drive SCSI busses, or 8-bit-wide/slow single-ended-drive SCSI busses, depending on the interface chips used in to drive disk-connection busses 139.

In one embodiment, up to six disk subsystems 104 can be connected to one main computer 102, providing scalability to the needs of the user. In one such embodiment, portions of disk-processing tasks are offloaded from main computer 102 into each disk subsystems 104, allowing scalable system performance improvements by adding disk subsystems 104 subsystems. In another embodiment, multiple main computers 102 are also connected to high-performance external bus 198, providing additional system performance or redundancy (for additional reliability) or both.

Figure 2:
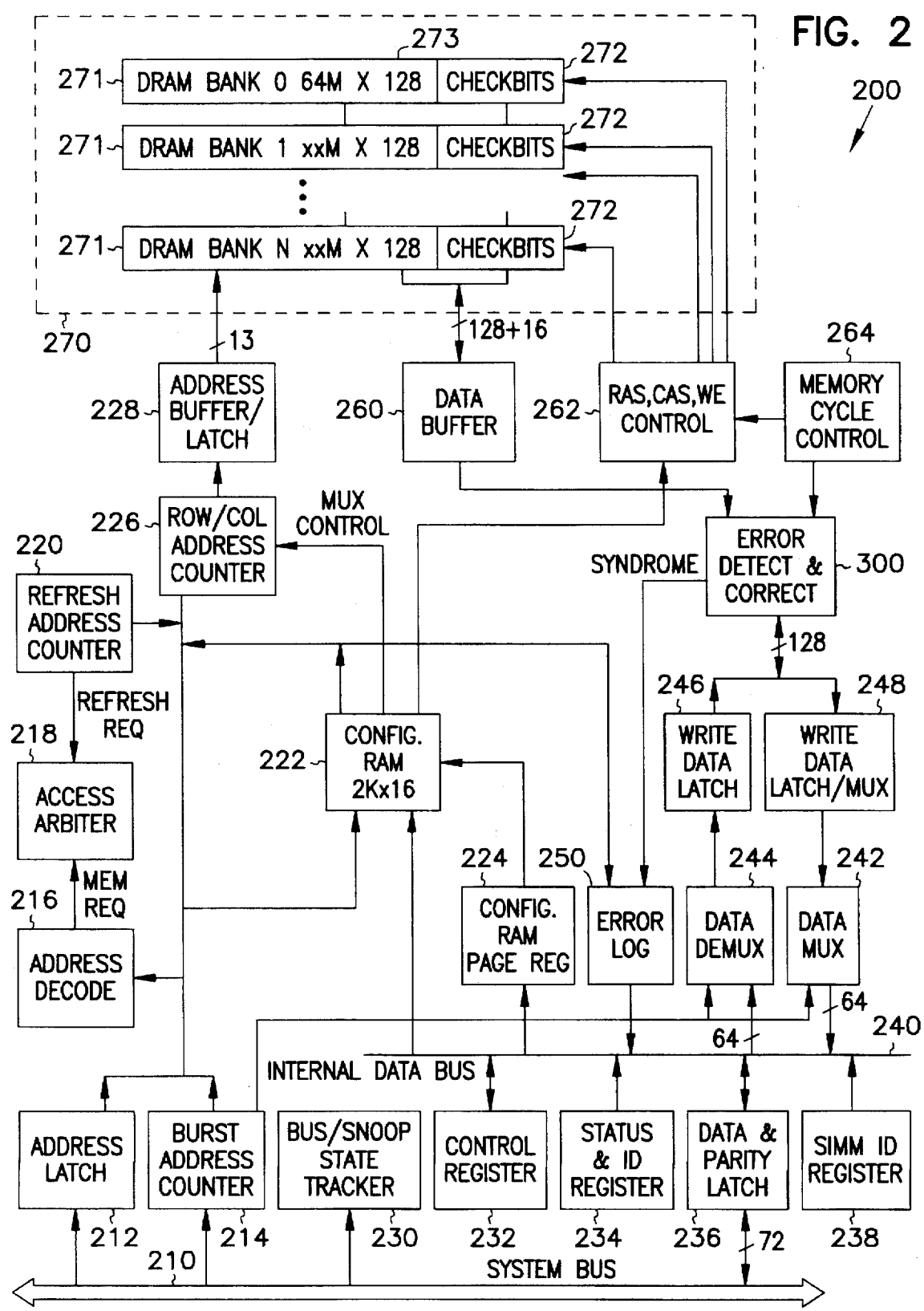
FIG. 2 is a block diagram illustrating an exemplary memory subsystem 200 including an MBED circuit 300 according to the present invention.

FIG. 2 is a block diagram illustrating memory system 200 including a multiple-bit-error detection ("MBED") circuit 300 according to the present invention. Prior-art SBEC/DBED chips, such as the IDT49C466 type 64-bit flow-through error detection and correction unit chip made by Integrated Device Technology Inc., are available and are designed to correct all single-bit errors and detect all double-bit errors and many multiple-bit errors within a 64-bit-wide data word and a 8-bit-wide ECC check-byte; however there has heretofore been nothing to teach how such SBEC/DBED chips might be used to detect all three-bit and four-bit errors which occur within a single four-bit-wide memory chip used as one of a plurality of memory chips. As memory densities (i.e., the number of bits per chip) have increased, it has become desirable in many cases to use memory configurations which utilize prior-art SBEC/DBED algorithms and circuits along with memory chips which present data interfaces that are more than one bit wide, and in particular, to use memory chips that have data interfaces that are four-bits wide (i.e., presenting four data bits in parallel), such as 4-by-1 megabit, 4-by-4 megabit, or 4-by-16 megabit chips.

What would be desirable, and what the present invention provides is a method for converting a SBEC/DBED code into a code which, in addition to correcting any single-bit error and detecting all double-bit-errors, will also detect all three-bit and four-bit errors which occur within a single memory chip which has a four-bit-wide data interface ("four-bit-wide chips," in which four data bits are read or written in parallel from one address location). What needs to be done, and what the present invention does is to arrange the order of bits presented to the SBEC/DBED chip in an order such that multiple-bit errors which are detected by the SBEC/DBED code are within single four-bit-wide chips, and thus the prior-art SBEC/DBED circuits handle the detection of three-bit and four-bit errors caused by the failure of single chips. (All one- and two-bit errors are detected—by definition—by a SBEC/DBED code. Three-bit errors must be detected since a total failure of a four-bit-wide memory chip may result in only three bits in error, such as if a 1011 binary pattern were changed to a 0000 pattern by the chip failing and driving all bits to zero. Four-bit errors must, of course, also be detected.) Such single-chip failures comprise one major mode or cause of system errors. Such single chip failures may or may not result in all bits of the chip being driven to the same state, e.g., to 0000 or 1111 binary, so it is desirable to detect bits which have flipped to the opposite state from what they should be.

Another benefit which the present invention provides is the capability to find a bit-connection order which maximizes certain error-detection capabilities in other memory-system configurations. In some embodiments, it is desirable to detect as many multiple-bit errors which occur within a single chip as possible, or to detect certain types or patterns of multi-bit errors which represent common failure modes of the memory chips or other components, even though perhaps not all multiple-bit errors can be detected. For example, memory cirsuits having an eight-bit-wide data interface are available. The present invention provides a method, described more fully below, which can be used to determine which connection-order provides the system with the highest number of detected errors among some pre-determined subset of all possible multi-bit errors, the least number of undetected or mis-corrected errors, or the "best" detection (by some criteria determined by the memory-system designer or user) of common failure modes. Thus, if certain failures which affect the system are more likely (such as a complete failure of a single chip or module, or some pre-determined pattern of erroneous bits), the method of the present invention can be tailored to detect preferentially as many of such failures as desired or possible. The designer can also choose which errors or failure modes should be selected for, thus tailoring the protection achieved for certain environments or parts, for example, choosing one bit-connection order which optimizes for detecting errors in a first part used in the system when failures in that part are thought more likely, and alternatively choosing a second, different connection order which optimizes for detecting errors in a second part in circumstances when those errors are thought more likely.

In one embodiment, an off-the-shelf SBEC/DBED chip, such as the IDT49C466 type 64-bit flow-through error detection and correction unit chip made by Integrated Device Technology Inc., is used as the basis for MBED circuit 300, and thus is the starting point used in order to derive a connection order for bits between a plurality of 3-bit and/or 4-bit memory chips and the MBED circuit 300. In one such embodiment, two IDT49C466 type 64-bit flow-through error detection and correction unit chips are used in parallel to provide SBEC/DBED functions on each or two 64-bit data words read or written together as part of a 128-bit memory operation to a memory array 270. In another embodiment, a SBEC/DBED code, such as can be commonly obtained or derived from a textbook or publication on memory circuits or error correction/detection, is used as the starting point, in order to derive a connection order for bits between a plurality of multiple-bit-wide memory circuits (such as 4-bit-wide memory chips) and the MBED circuit 300 based on the SBEC/DBED code.

It is possible for many, if not all, circuits which provide a SBEC/DBED function to be connected to the respective multiple-bit memory chips in such a bit-order as to detect all three-bit and four-bit errors which appear on the data interface of any single memory chip. Unfortunately, such a connection order is not apparent from the data sheet nor the ECC formula which corresponds to a given SBEC/DBED chip or circuit, e.g., a 72-bit SBEC/DBED code circuit designed to be used with a 64-data-bit memory bus. A brute-force attempt to test every combinatorial of 72 memory data/ECC bits to 72 ECC chip pins would generally take an unacceptably long time. It is thus desirable in one embodiment of the present invention to have a method to discern the most likely starting order and refine and verify the connection order in order to derive an improved connection order which detects all 3-bit and 4-bit errors within one memory chip.

While one embodiment described herein includes a SBEC/DBED circuit or other error-correcting circuit, the present invention is also used advantageously with any error-detection circuit capable of detecting errors occurring in two or more bits of a data word. Such circuits can be generalized as "multi-bit error detection" ("MBED") circuits.

FIG. 2 is a block diagram illustrating an exemplary memory subsystem 200 including an MBED circuit 300 according to the present invention. In one embodiment, system bus 210 is also used as high-performance external bus 198 of FIG. 1. In another embodiment, separate busses are provided for high-performance external bus 198 and system bus 210. In one embodiment, system bus 210 can be used to access single memory locations, the address of which is latched in address latch 212, and can also be used to access a consecutive string of locations, the addresses of which are tracked by burst address counter 214 used in conjunction with address latch 212. Memory requests are fed through address decode 216 and thereafter to access arbiter 218. Memory refresh requests are tracked by refresh address counter 220 which also feeds access arbiter 218, which determines the relative priorities of memory requests versus refresh requests. Configuration RAM 222 and configuration RAM page register 224 are loaded via internal bus 240, and control the mapping of system bus addresses to memory subsystem addresses and memory chip addresses by generating multiplex control signals which drive row/column address multiplexor ("mux") 226. In one embodiment, row/column address mux 226 drives address buffer/latch 228; which in one embodiment latches the multiplexed address signals, and in another embodiment, buffers (amplifies) the multiplexed address signals. The multiplexed address signals then drive memory array 270. In one embodiment, memory array 270 comprises a plurality of DRAM banks 271, each DRAM bank 271 comprising data bits 273 having M words of N data bits each and checkbits 272 having M words of K checkbits each. In one such embodiment, M is up to 64 megawords, N is 128 data bits (i.e., a data word up to 128 data bits wide is read or written as a single operation) comprised of two 64-bit data parts, and K is 16 checkbits comprised of two 8-bit checksum parts. In one embodiment, 128 bits of data and 16 bits of checksum are read or written in parallel to/from data buffer 260. RAS/CAS/WE control 262 and memory cycle control circuit 264 work cooperatively in order to control the function and timing signals needed to control memory array 270 in a manner well known in the art.

Data from and to data buffer 260 is passed through MBED circuit 300 and either to read data latch/mux 248 or from write data latch 246 which operate on 128-bit words. Error syndromes for errors detected by MBED circuit 300 are passed to error log circuit 250 (as are addressing errors detected by configuration RAM 222). The 128-bit words of read data latch 248 are multiplexed into a series of 64-bit words by data multiplexor (mux) 242 and coupled to internal bus 240. Likewise, 64-bit words from internal bus 240 are demultiplexed by data demultiplexor (demux) 244 and coupled to write data latch 246. 64-bit data words from internal bus 240 have parity generated by data & parity latch 236, one parity bit for every 8 bits of data, in order to generate 72-bit data/parity words which are driven onto system bus 210, and conversely, 72-bit data/parity words from system bus 210 are checked for proper parity, stripped to 64-data-bit words, and driven to internal bus 240. In an alternative embodiment, parity is not used on system bus 210, and data is passed without generating or detecting parity in data & parity latch 236. Control register 232, which controls the overall state of memory system 200, Status-and-ID register 234, which reports the identity and status of memory subsystem 200 to computer system 100, and SIMM-ID register 238, which stores the identification numbers of the single-in-line-memory-modules (SIMMs) comprising memory array 270, are each connected to and controlled from internal bus 240. Bus/snoop state tracker 230 monitors the state of system bus 210 in order to optimize the performance of memory subsystem 200.

Figure 3:
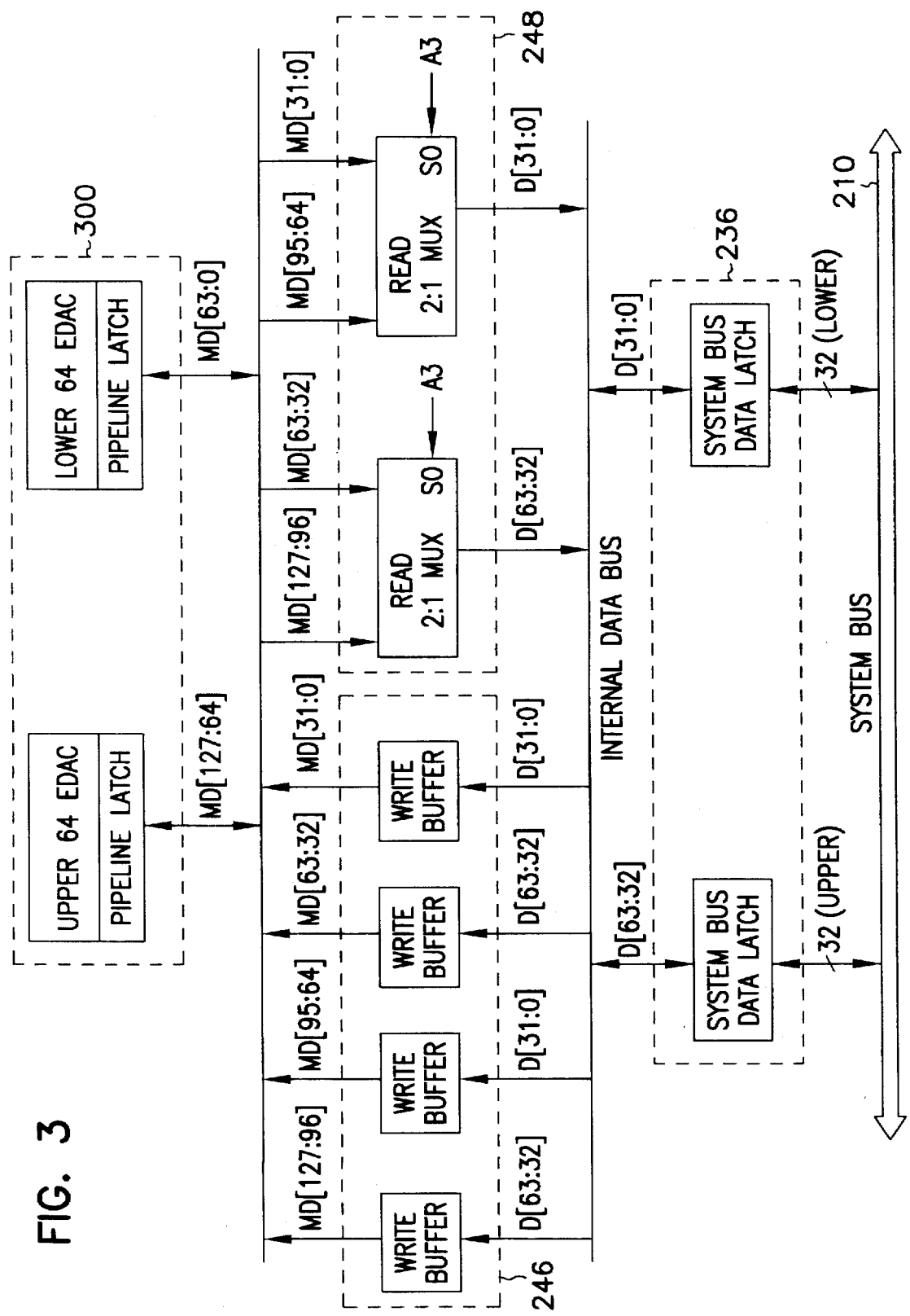
FIG. 3 is a block diagram illustrating details of one embodiment of the data path between MBED circuit 300 and system bus 210 according to the present invention.

FIG. 3 is a block diagram illustrating details of one embodiment of the data path between MBED circuit 300 and system bus 210 according to the present invention. In the embodiment shown, 64 bits can be read or written in parallel from system bus 210 from or to both the system bus data latches 237 within data & parity latch 236; alternatively, 32 bits can be written or read from one or the other system bus data latches 237 within data&parity latch 236 to effect 32-bit transfers (the parity generation/detection/stripping circuitry is not shown in this embodiment). In the embodiment shown, the data demux function of data demux 244 is performed within the write buffers of write data latch 246. In the embodiment shown, the data mux function of data mux 242 is performed within the read data latches/2:1 mux of read data latch 248. In the embodiment shown, MBED circuit 300 is implemented by using two 64-bit error detection and correction (EDAC) circuits as shown, one for the upper 64 bits and one for the lower 64 bits. In one embodiment, two IDT49C466 type 64-bit flow-through error detection and correction unit chips made by Integrated Device Technology Inc., are used in parallel in MBED circuit 300, each having a pipelined latch to facilitate data flow through memory subsystem 200. Such a configuration provides SBEC/DBED protection on each 64-bit half of each 128-bit data word, thus allowing certain double-bit errors (such as any single-bit error in the lower 64 bits and any single-bit error in the corresponding upper 64 bits of that data word) to be corrected and also allowing any of certain four-bit errors in a 128-bit data word (such as any double-bit error in the lower 64 bits and any double-bit error in the corresponding upper 64 bits of the same data word) to be detected. With the improved error detection provided by the present invention, any single chip failure (even with three or four bits in error) in the lower 64 bits and any single chip failure (even with three or four bits in error) in the upper 64 bits at the same time will be detected, thus providing improved detection of up to eight bits in error in any single 128-bit data word.

Figure 4:
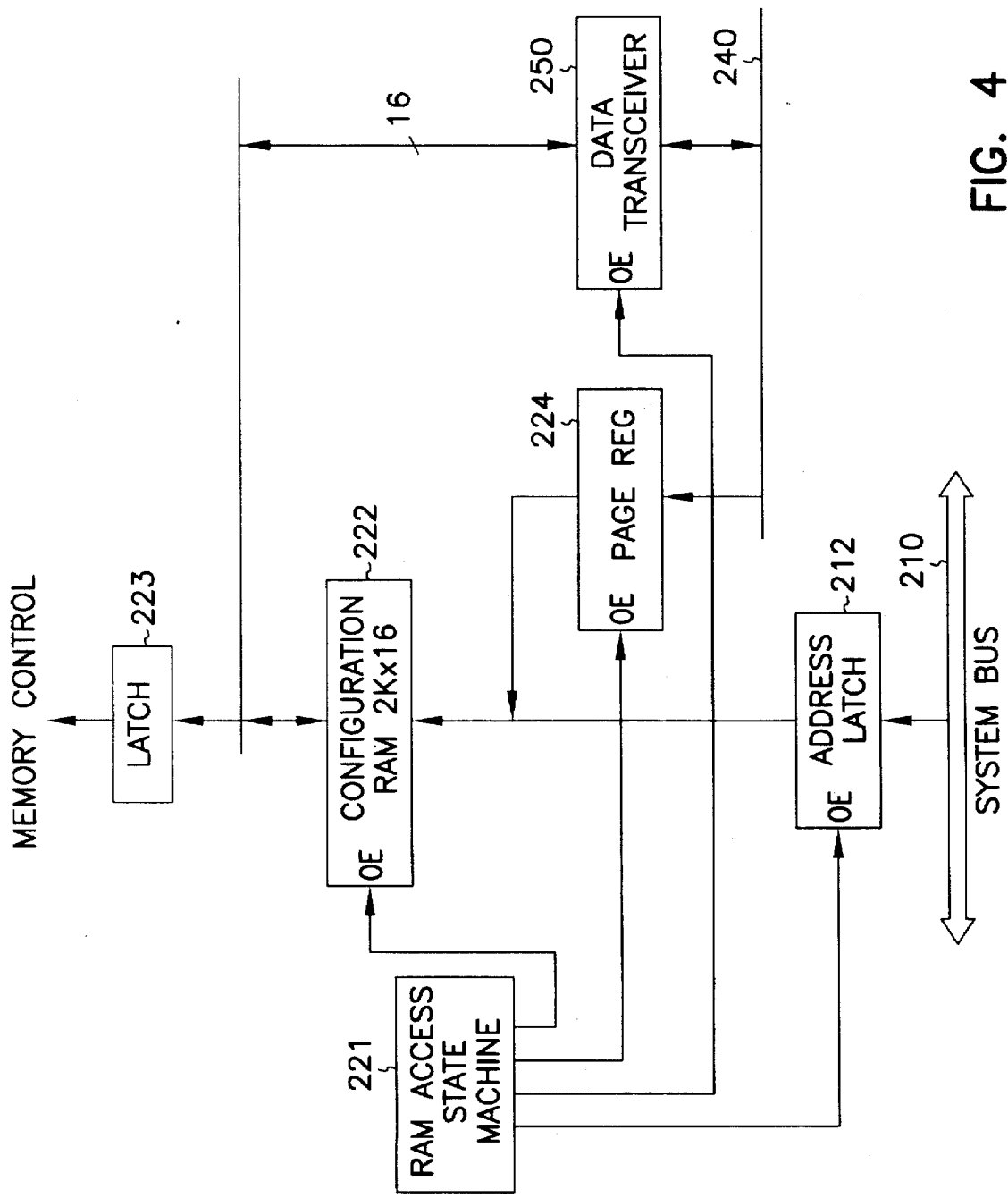
FIG. 4 is a block diagram illustrating details of one embodiment of the address path within system bus 210.

FIG. 4 is a block diagram illustrating details of one embodiment of the address path within system bus 210. In the embodiment shown, RAM access state machine 221 is used to control the flow of addresses by providing output enable (OE) signals for configuration RAM 222, configuration RAM page register 224, error log circuit 250, and address latch 212. Latch 223 is used to latch the data from configuration RAM 222. In this embodiment, a data tranceiver is used to implement error log circuit 250.

FIG. 5 is an address-decoding diagram illustrating details of address decoding used in one embodiment memory subsystem 200. In the embodiment shown, the lowest 4 bits are use to select 8-bit bytes within 128-bit words. The next ten bits (bit numbers 4 through 13) are used for column address bits. Row address bits are derived from the next 10, 11, 12, or 13 bits (bit numbers 14 through 23, 24, 25, or 26 respectively for 1M, 4M, 16M or 64M banks respectively), as shown. The bits above the row bits are used to obtain high-order column bits needed, if necessary (bits 25 for the 4M-bank case; bits 26 & 27 for the 16M-bank case; and bits 27, 28 & 29 for the 64M bank case).

FIG. 6 is an addressing map for of one embodiment of memory subsystem 200 used in an IBM-compatible-type computer system 100. The left-most column shows address ranges provided by the banks as shown.

FIG. 7 shows the scheme used to test the memory scrub in one embodiment of memory subsystem 200. This verifies that only words having single-bit errors will be modified, and that zero-error and multi-bit errors are not.

FIG. 8 is a bit map showing which data bits are involved in the generation of each of the eight respective checkbits CB0 through CB7, and the even/odd parity used. The FIG. 8 bit map shows that, for this exemplary error-correction code, data bits 1, 2, 3, 5, 8, 9, 11, 14, 17, 18, 19, 21, 24, 25, 27, 30, 32, 36, 38, 39, 42, 44, 45, 47, 48, 52, 54, 55, 58, 60, 61, and 63 are exclusive-ORed together in order to generate checkbit CB0. Similarly, other rows show how the data bits are exclusive-ORed together (in the case of checkbits CB2 and CB3, an exclusive-NOR is used for odd parity) in order to generate each of the other checkbits for this embodiment. The FIG. 8 bit map also shows, for example, that data bit 0 affects checkbits CB7, CB6, CB3, CB2, and CB1; thus if only data bit 0 is wrong (i.e., the bit is inverted from what it should be), the checkbits will mismatch on bits 7, 6, 3, 2, and 1; equivalent to a binary pattern of '11001110'b, or hexadecimal 0xCE (herein the notation for hexadecimal numbers are preceded by "0x"). The pattern of checkbit mismatch is called the "syndrome" of the error, where bits mismatching are one (1) and bits which match are zero. Thus the syndrome for date bit 0 being wrong is 0xCE ('11001110'b ), and the syndrome for bit 1 being wrong is 0xCB ('11001011'b). Note that if both data bit 0 and data bit 1 are wrong, then the resultant syndrome is equivalent to the exclusive-OR ("XOR") of the individual syndromes, here for example:

$$0xCE<XOR>0xCB=0x05.$$

Also note that 0x05 is also the syndrome for other two-bit errors (such as data bits 16 and 17 both wrong, or data bits 32 and 33 both wrong), as well as for many multiple-bit errors. For the purposes of one embodiment of the method for determined the connection order of memory bits to the error-detection circuit, the fact that even parity (versus odd parity) is generated for any particular checkbit is not important, since when any one particular data bit is wrong, it will affect (invert) the checkbits in the same manner.

FIG. 9 is a bit map showing which bit or bits are in error for each of the possible 256 syndrome codes for one embodiment of MBED circuit 300. Note that a syndrome of all zero (0x00) is indicative of no errors, and corresponds to the table entry of "*". (Syndrome bits S0 through S7 correspond to checkbits CB0 through CB7, respectively.)

The columns of the FIG. 9 table are used for the first hexadecimal digit of the syndrome code, and the rows for the second hexadecimal digit of the syndrome code. Thus, for example, syndrome 0xCE is indicated in the table in column "C" and row "E", and the table shows a single-bit error in data bit 0; syndrome 0xCB is indicated in the table in column "C" and row "B", and the table shows a single-bit error in data bit 1; syndrome 0x05 is indicated in the table in column "0" and row "5", and the table shows a "T" indicating a two-bit error (the corresponding data bits for which cannot be determined accurately from the syndrome). For the table in FIG. 9, "*" indicates no errors detected; a one or two-digit decimal number indicates the bit position of the data bit in which a single-bit error was detected; "T" indicates a two-bit error detected; "M" indicates a multi-bit error detected; and "C" followed by a single digit indicates the bit position of the checkbit in which a single-bit error was detected (i.e., C0 through C7 correspond to single-bit errors in checkbits CB0 through CB7, respectively).

FIGS. 10A & 10B can be placed next to one another, and show various data patterns (shown in hexadecimal digits) which can be used to test generation of each syndrome data pattern by computer system 100. 256 different data patterns are shown, each corresponding to a different one of the 256 possible checkbit patterns. This table is used to generate a test program which writes each data pattern into memory subsystem 200, in order to test the parity generation tree in MBED circuit 300.

FIGS. 11A, 11B, & 11C show various checkbit data patterns which can be used to test various error log syndromes. Each respective data word shown in FIGS. 11A, 11B, and 11C is written to data bits 273 in memory array 270 using MBED circuit 300 to generate the corresponding checkbits 272 (for example, a data word of 0x0000000000000000 generates checkbits 0x0C, since checkbits CB3 and CB2 are generated with "odd parity" which is equivalent to exclusive-NOR). The original checkbits are the modified by overwriting just the checkbits with the data in the "modified" column. (One embodiment of computer system 100 allows writing of just the checkbits 272 without modification of data bits 273, in order to facilitate testing. Another embodiment of computer system 100 allows writing of just the data bits 273 without modification of checkbits 272, in order to facilitate testing. Yet another embodiment of computer system 100 allows writing of both data bits 273 and checkbits 272 with arbitrary patterns, in order to facilitate testing.) The syndrome is generated by exclusive-ORing the pattern which should be generated by the data with the checkbits, thus the syndrome is obtained by exclusive-ORing the pattern in the "original" column with the pattern in the "modified" column to generate an 8-bit syndrome in the "error log syndrome" column (for example in the first row of FIG. 11A, the original checkbits are 0x0C, the modified checkbits are 0xC2, thus the syndrome is the XOR of these which is equal to 0xCE and which corresponds to a single-bit error in data bit 0 as shown in the "bit in error" column).

FIG. 12 shows a table of various 32-bit data words and their corresponding checkbit data patterns, which can be used to test various error log syndromes.

FIG. 13 shows various data patterns, and the corresponding checkbit pattern which should be generated, which can be used to test various error log syndromes. The patterns shown in FIG. 13 each have only a single data bit "on," except for the first data pattern which is all zeros.

FIG. 14 shows one bit-connection pattern according to the present invention between four-bit-wide memory circuits in memory array 270 and one SBEC/DBED chip, the IDT49C466 type 64-bit flow-through error detection and correction unit chip made by Integrated Device Technology Inc., as used in this embodiment of MBED circuit 300. FIGS. 8 and 9 correspond to the MBED code used for this embodiment. For this embodiment, MBED circuit 300 detects and corrects all single-bit errors, detects all two-bit errors (but does not correct them) and detects some, but not all, multiple-bit errors. Using the bit-connection order shown in FIG. 14 however, MBED circuit 300 detects all one-bit, two-bit, three-bit and four-bit errors which occur within a single one of the four-bit-wide memory circuits in memory array 270. In this embodiment, single-bit errors are corrected, and program execution continues. In one such embodiment, the occurrence of single-bit corrected errors is logged by error log 250 in order that maintenance can later be performed if too many such single-bit errors occur, especially if concentrated in one component of the system. In one embodiment, two-bit error indications and multi-bit error indications are both treated as uncorrectable multi-bit errors. In one such embodiment, such uncorrectable errors are surfaced to the system as exigent errors and cause program execution to stop, in order that the error gets noticed by a human user, and maintenance can be immediately performed. In another embodiment, an attempt is made to continue execution, with the memory area detected as having the error being marked as unreliable.

Figure 15:
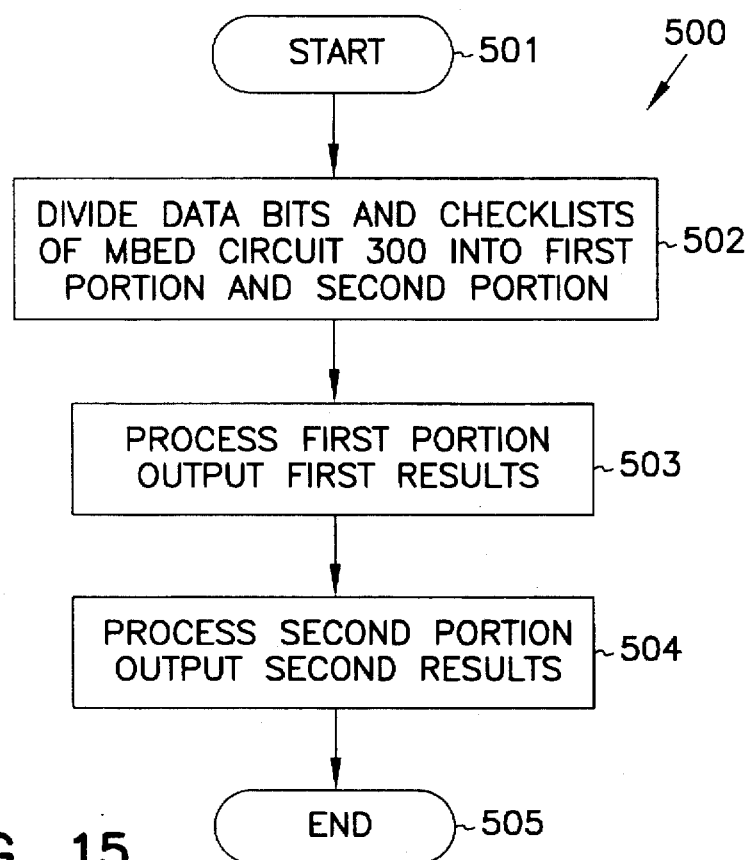
FIG. 15 shows a flowchart of one embodiment of the method 500 for determining an optimal bit-connection order between MBED circuit 300 and the plurality of individual memory circuits.

FIG. 15 shows a flowchart of one embodiment of the method 500 for determining an optimal bit-connection order between MBED circuit 300 and the plurality of individual memory circuits comprising memory array 270. In this embodiment, the method starts at block 501 and goes to block 502. At block 502, the data bits and checkbits are divided (or selected) into a first portion and a second portion. In one such embodiment, a human user performs this step, and chooses the upper-order (most significant) 32 data bits and four of the checkbits for the first portion, and the lower-order (least-significant) 32 data bits and the other four checkbits for the second portion; the user then customizes test-and-re-ordering program 510 (see FIG. 16) with the first portion of the bits and runs program 510 at step 503 which outputs a first set of results. The user then customizes test-and-re-ordering program 510 (see FIG. 16) with the second portion of the bits and runs program 510 at step 504 which outputs a second set of results. The process then ends at block 505.

In one embodiment, the method 500 is iteratively performed, wherein the outputted first results indicate to the user a connection order which is partially successful, and the user uses the outputted first results to help in selecting bits, and thus selects a smaller subset of the previous first portion of bits including those bits connections which previously yielded erroneous results (i.e., results which indicate either no error or single-bit error for multiple-bit errors). That is, the user keeps most of the memory-chip connections which successfully detected multi-bit errors, but selects a smaller subset of memory-chip connections to re-process through step 503. This can result in substantially faster processing time, since fewer bits are being tested and rearranged. Similarly, the output of second results after the initial second portion of bits can be used to select a smaller subset of those bits for subsequent processing.

Figure 16:
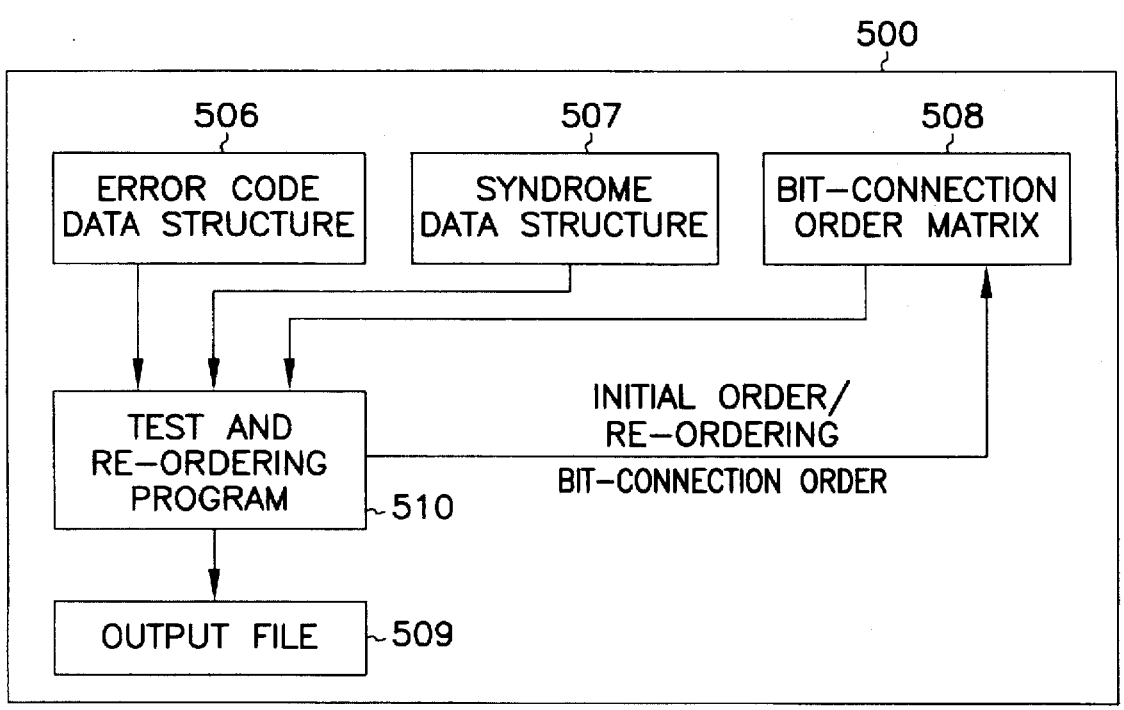
FIG. 16 shows a diagram of one embodiment of the structures used in method 500 for determining an optimal bit-connection order between MBED circuit 300 and the plurality of individual memory circuits comprising memory array 270.

FIG. 16 shows a diagram of one embodiment of the structures used in method 500 for determining an optimal bit-connection order between MBED circuit 300 and the plurality of individual memory circuits comprising memory array 270. In this embodiment, the method uses error-code ("EC") data structure 506 and syndrome data structure 507 to control test-and-re-ordering program 510. In one such embodiment, program 510 initializes bit-connection-order matrix 508 using a pseudo-random seed to help determine the initial bit-connection order. In one embodiment, as program 510 runs, it outputs results to output file 509 each time a bit-connection order yields results which meet some criterion, such as having the same-number-or-fewer erroneous results than previous attempts. In one such embodiment, output file 509 is printed to paper.

Figure 17:
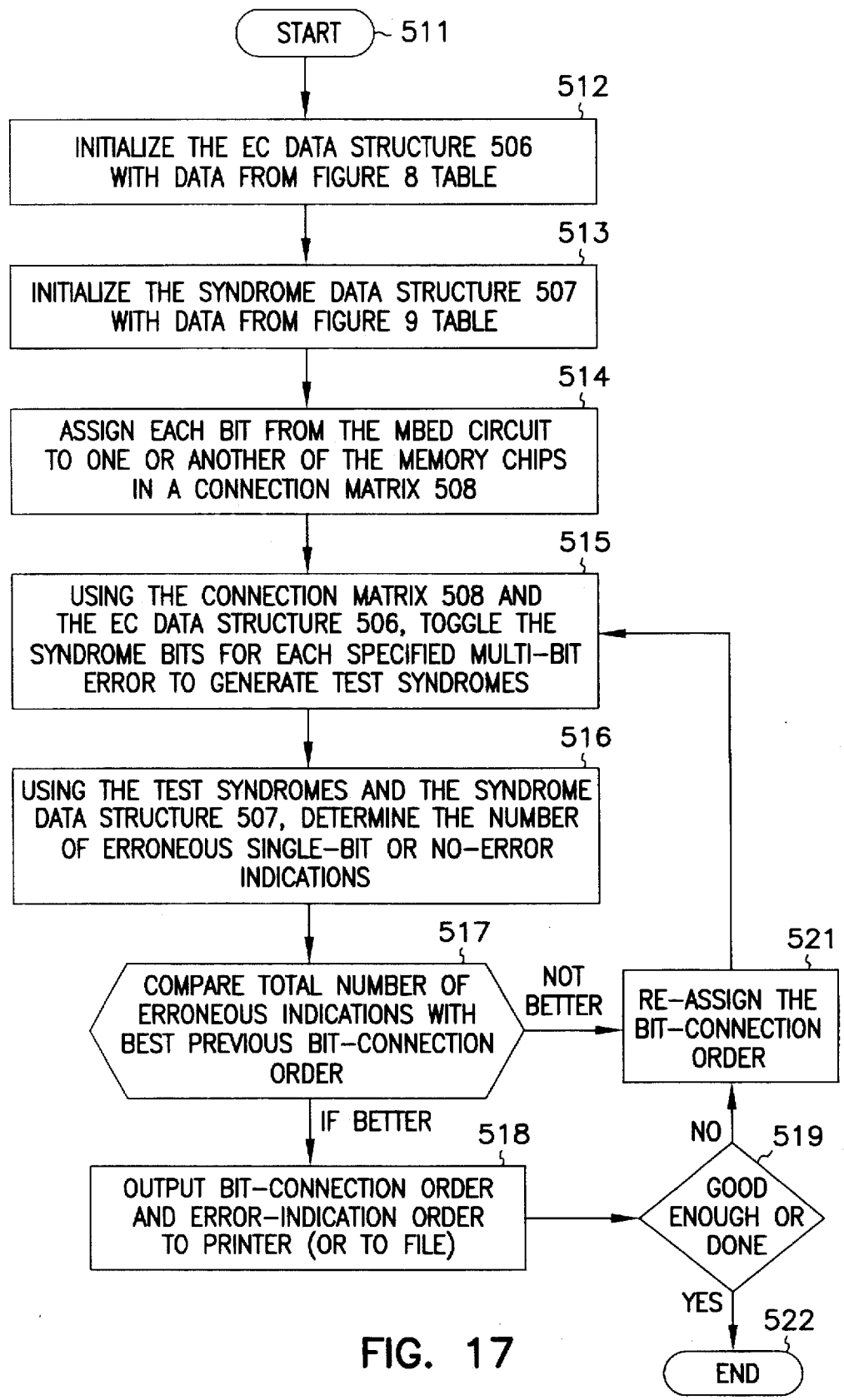
FIG. 17 shows a more detailed flow chart of program 510.

FIG. 17 shows a more detailed flow chart of program 510. Program 510 begins at start block 511. At block 512, the EC data structure 506 is initialized. In one embodiment, an 8-row, 64-column integer matrix is used to hold the data from FIG. 8, wherein a 1 is used in EC data structure 506 for each "X" in FIG. 8 and 0 is used otherwise. At block 513, the syndrome data structure 507 is initialized. In one embodiment, a 16-row, 16-column character matrix is used to hold the data from FIG. 9, wherein a "0" is used in syndrome data structure 507 for the "*" in FIG. 9, a "c" is used in syndrome data structure 507 for each "C0" through "C7" (indicating the single-bit checkbit errors) in FIG. 9, a "b" is used in syndrome data structure 507 for each "0" through "63" (indicating the single-bit data bit errors) in FIG. 9, a "t" is used in syndrome data structure 507 for each "T" (indicating the two-bit errors) in FIG. 9, and an "m" is used in syndrome data structure 507 for each "M" (indicating the multiple-bit errors) in FIG. 9. For the purposes of this embodiment, a "t" or "m" result is considered non-erroneous, since either of these indicates to computer system 100 that a multiple-bit non-correctable error has been detected. Although a "t" result (meaning a two-bit detected error) may be technically wrong if in fact more than two bits are actually inverted from what they should be, the computer system 100 treats all such uncorrectable errors as multiple-bit failures requiring exigent service. For the purposes of this embodiment, a "0," "b," or "c" result is considered erroneous, since the errors being tested for each have more than two bits inverted, and such results will cause the error to go undetected and/or will cause the error to be mis-corrected.

At block 514, bit-connection-order data structure 508 is initialized. In one embodiment, an 4-row, 9-column integer matrix is used as bit-connection-order data structure 508 to hold the bit-connection order, wherein each entry contains a bit number of the connection to MBED circuit 300, and wherein half (i.e., thirty-six) of the possible bits (i.e., seventy-two) of the MBED circuit are rearranged in each running of program 510 (i.e., per pass through step 503 of FIG. 15). In one such embodiment, the data-bit numbers are designated with the positive integers 0 through 63 and the checkbit numbers are designated with the negative integers −8 through −1. In one embodiment, checkbits are all assigned to one row of bit-connection-order data structure 508, in order that no more than one checkbit is assigned to any one memory chip (and, since the rearrangement process for this embodiment involves only shifting of the bits, this condition will remain in effect throughout the execution of program 510).

At block 515, each specified multi-bit error is tested, using the bit-connection-order data structure 508 and the EC data structure 506 to generate a separate test syndrome for each respective error. In one such embodiment, each column of bit-connection-order data structure 508 specifies four bits which are connected to a single memory chip in memory array 270. For such a four-bit chip, there are five possible multiple-bit errors having more than two bits wrong, i.e., XXXX, XXX0, XX0X, X0XX, and 0XXX, where each "X" represents a single-bit error; thus there are one 4-bit error and four 3-bit errors to test. Thus, the 4-bit column contains four indexes. For each "X" of the particular error being tested, the corresponding index is used to access an 8-bit column of EC data structure 506, and for each "1" found in EC data structure 506, the corresponding bit in the test syndrome is toggled.; this process is repeated until all error bits have been incorporated into the test syndrome. Thus five test syndromes are generated, one for each of the five specified multi-bit errors.

At block 516, each test syndrome is used to access the corresponding entry in syndrome data structure 507. As described above, one embodiment considers each "0", "b", or "c" as an erroneous result, since a multi-bit error is erroneously detected with a single-bit or no-error indication; and "t" and "m" entries are considered non-erroneous, since the multi-bit error was detected as a non-correctable error. In another embodiment, syndrome data structure 507 contains only one of two possible values for each entry: either an erroneous indication value or a non-erroneous indication value.

At block 517, the number of erroneous indications (or equivalently, the converse number of non-erroneous indications) is checked to see if the bit-connection order currently being tested is better than previously test bit-connection orders; and if so, control passes to block 518 and the bit-connection order is output to a file or to a printer or other output device. If at block 517, the bit-connection order is not better than previous orders, control is passed to block 521. At block 519, a test is done to determine whether the last output bit-connection order was good enough (for example, whether no erroneous indications are found in the bits tested, or whether the number is below some threshold), and if so, the program ends at block 522, else control passes to block 521.

At block 521, the bit-connection order is re-assigned. In one embodiment, one row of bit connections is shifted one column, thus moving one of the four single-bit connections from one module to the next across all 9 modules, while leaving the other three bits connected as they were. After each bit connection of the first row has been tested in every column position, the next row is shifted one column position, and again the first row is tested in each of 9 positions. This process is iterated until each row has been tested with every other row in every position, and then the program is exited to block 522.

The best result from one such pass through program 510 is sometimes a bit-connection order which results in one, two, or three erroneous results. The user then (at block 502 of FIG. 15) selects the bit-connections in all columns containing the erroneous results, plus zero, one or two other columns to re-process. Such a subset of the bits is then processed at step 503 in a much faster time than if all bits in all columns are tested. The remaining columns (those not selected at the second pass through step 502) contain bit-connections each of which has multi-bit errors giving non-erroneous (i.e., "m" or "t") results.

Thus, in one embodiment, the user splits 64 data bits and 8 checkbits into two portions, each of which is to be connected to nine 4-bit-wide modules and processed by program 510 to determine the best bit-connection order. In one such embodiment, program 510 initially outputs results in which many modules have all multi-bit errors detected as such, and a few modules having multi-bit errors erroneously detected with single-bit or no-error indications. The user then selects the pin connections of a few memory circuits, including the erroneous-indicating ones for reprocessing as a smaller subset, and modifies program 510 to test and rearrange just those few pins until a bit-connection order is found having with no erroneous indications. In another embodiment, the entire process is programmed as one single all-encompassing program.

In another embodiment, a similar process is used to find a "best" (by some criteria) bit-connection order for 8-bit (or other width chips) memory chips, by testing 5-bit, 6-bit, or n-bit errors across such n-bit-wide chips to determine a bit-connection order which minimizes the number of undetected certain of such errors.

In one embodiment, a C-language program, such as is shown in Table 1 below, is used for program 510 when used for the upper-order portion of bits (i.e., for step 503 to process 32 upper-order data bits and four checkbits). (Note that this program is modified in function RANDFILL which has five lines which are changed by commenting-out five functional lines setting up the bit-connection matrix and replacing those with five corresponding lines from the comments, as shown below in the RANDFILL routine.)

```
/* Table I: upfill.c  Version of program 510 used for upper-order 32 data bits */
/*                    and four of the checkbits */
/* Error Detect and Correct bit-connection order algorithm for the 49C466 */
#include <stdio.h>
#include <time.h>
char genedc();
void parseln();
void randfill();
void shiftset();
```

22

```
static int cb[8][64] = {
    { 0,1,1,1,0,1,0,0,  1,1,0,1,0,0,1,0,  0,1,1,1,0,1,0,0,  1,1,0,1,0,0,1,0,
      1,0,0,0,1,0,1,1,  0,0,1,0,1,1,0,1,  1,0,0,0,1,0,1,1,  0,0,1,0,1,1,0,1 },
    { 1,1,1,0,1,0,1,0,  1,0,1,0,1,0,0,0,  1,1,1,0,1,0,1,0,  1,0,1,0,1,0,0,0,
      1,1,1,0,1,0,1,0,  1,0,1,0,1,0,0,0,  1,1,1,0,1,0,1,0,  1,0,1,0,1,0,0,0 },
    { 1,0,0,1,1,0,0,1,  0,1,1,0,0,1,0,1,  1,0,0,1,1,0,0,1,  0,1,1,0,0,1,0,1,
      1,0,0,1,1,0,0,1,  0,1,1,0,0,1,0,1,  1,0,0,1,1,0,0,1,  0,1,1,0,0,1,0,1 },
    { 1,1,0,0,0,1,1,1,  0,0,0,1,1,1,0,0,  1,1,0,0,0,1,1,1,  0,0,0,1,1,1,0,0,
      1,1,0,0,0,1,1,1,  0,0,0,1,1,1,0,0,  1,1,0,0,0,1,1,1,  0,0,0,1,1,1,0,0 },
    { 0,0,1,1,1,1,1,1,  0,0,0,0,0,0,1,1,  0,0,1,1,1,1,1,1,  0,0,0,0,0,0,1,1,
      0,0,1,1,1,1,1,1,  0,0,0,0,0,0,1,1,  0,0,1,1,1,1,1,1,  0,0,0,0,0,0,1,1 },
    { 0,0,0,0,0,0,0,0,  1,1,1,1,1,1,1,1,  0,0,0,0,0,0,0,0,  1,1,1,1,1,1,1,1,
      0,0,0,0,0,0,0,0,  1,1,1,1,1,1,1,1,  0,0,0,0,0,0,0,0,  1,1,1,1,1,1,1,1 },
    { 1,1,1,1,1,1,1,1,  0,0,0,0,0,0,0,0,  0,0,0,0,0,0,0,0,  1,1,1,1,1,1,1,1,
      1,1,1,1,1,1,1,1,  0,0,0,0,0,0,0,0,  0,0,0,0,0,0,0,0,  1,1,1,1,1,1,1,1 },
    { 1,1,1,1,1,1,1,1,  0,0,0,0,0,0,0,0,  0,0,0,0,0,0,0,0,  1,1,1,1,1,1,1,1,
      0,0,0,0,0,0,0,0,  1,1,1,1,1,1,1,1,  1,1,1,1,1,1,1,1,  0,0,0,0,0,0,0,0 }
};
static char synd[16][16] = {
    { '0','c','c','t','c','t','t','b',  'c','t','t','b','t','m','m','t' },
    { 'c','t','t','b','t','m','m','t',  't','m','m','t','m','t','t','b' },
    { 'c','t','t','m','t','b','b','t',  't','b','b','t','m','t','t','m' },
    { 't','b','b','t','m','t','t','m',  'm','t','t','m','t','b','b','t' },
    { 'c','t','t','b','t','b','b','t',  't','b','b','t','m','t','t','b' },
    { 't','b','b','t','m','t','t','b',  'm','t','t','b','t','b','b','t' },
    { 't','b','b','t','m','t','t','m',  'm','t','t','m','t','b','b','t' },
    { 'm','t','t','m','t','b','b','t',  't','b','b','t','m','t','t','m' }, { 'b','t','t','m','t','b','b','t',  't','b','b','t','m','t','t','m' },
    { 't','b','b','t','m','t','t','m',  'm','t','t','m','t','b','b','t' },
```

```
                                            23
         { 't','b','b','t','b','t','t','m',   'b','t','t','m','t','b','b','t' },
         { 'b','t','t','m','t','b','b','t',   't','b','b','t','b','t','t','m' },
         { 't','b','b','t','m','t','t','m',   'm','t','t','m','t','b','b','t' },
         { 'm','t','t','m','t','b','b','t',   't','b','b','t','m','t','t','m' },
5        { 'b','t','t','m','t','m','m','t',   't','m','m','t','b','t','t','m' },
         { 't','m','m','t','b','t','t','m',   'b','t','t','m','t','m','m','t' }
     };

int mincb = 32;
10   int tries, lev1 = 0 ;
     unsigned long int next = 1;

main ()                                  /* Main section of program 510 */
     {
15       time_t crap;
         int i;
         int ram[4][9] = {
            { 0, 1, 2, 3, 4, 5, 6, 7,32},
            { 8, 9,10,11,12,13,14,15,33},
20          {16,17,18,19,20,21,22,23,34},
            {24,25,26,27,28,29,30,31,35}
         };
         int *testset;
         char *ln;
25       crap = time(&crap);
         i = (int)crap;
         srand(i);
         while (mincb != 0){          /* repeat until no erroneous result indications */
            randfill(ram);            /* start with pseudo-random bit-connection order */
30          shiftset(ram);            /* test and shift each row through each column */
```

24

```
      }
      printf("EDC64 Calculation (for, e.g., IDT49C466 circuit) \n");
      ;
      }
 5    char genedc(int *dbits)
      {
         int i ;
         int sh,sl;
         int cba[] = { 0,0,0,0, 0,0,0,0 };
10       int cbf[] = { 0,0,0,0, 0,0,0,0 };
         while ( *dbits < 64 ) {
           i= 0;
           if ( *dbits >= 0 )
             while ( i < 8 ) {
15              cba[i] += cb[i][ *dbits ];
                i++;
         }
           else
                cbf[*dbits+8]=1;     /* -8 refers to Checkbit CB0, -1 refers to Checkbit
20    CB7, etc.*/
           dbits++;
         }
      /*  printf("\nNumber of participants %d %d %d %d %d %d %d \n",
      cba[0],cba[1],cba[2],cba[3],cba[4],cba[5],cba[6],cba[7]);                          */
25       for (i=0; i<8; i++)
           cba[i] = (cba[i]- (int)(cba[i]/2) * 2);
      /*  printf("Syndrome bits     %d %d %d %d %d %d %d %d   ",
      cba[0],cba[1],cba[2],cba[3],cba[4],cba[5],cba[6],cba[7]);                          */
         sh = (cba[7]|cbf[7])*8 + (cba[6]|cbf[6])*4 + (cba[5]|cbf[5])*2 + (cba[4]|cbf[4]);
30       sl = (cba[3]|cbf[3])*8 + (cba[2]|cbf[2])*4 + (cba[1]|cbf[1])*2 + (cba[0]|cbf[0]);
``` return(synd[sl][sh]);
}

26

```
    void parseln(char *line,int *dbset)
    {
      int i = 0;
      int t = 0;
5     char tmp[2];
      while (line[i] != NULL) {
        if (isdigit(line[i])){
          tmp[1] = line[i++];
          if (isdigit(line[i])) {
10          tmp[0] = tmp[1];
            tmp[1] = line[i++];
          }
          else
            tmp[0] = '0';
15        dbset[t++] = ((int)tmp[0] -48 ) * 10 + ((int)tmp[1] - 48 ) ;
        }
        else
          i++;
      }
20    dbset[t] = 99 ;
    }
```

```
                                27
      void randfill(int rf[4][9]) {
        int bits[36];
        int i,t, found;
        int x,y = 0;
 5      for (i=0;i<36;bits[i++]=0);
        for (x=0;x<4;x++)
          for (y=0;y<9;y++) {
            found = 0;
            while(found == 0) {
10            i = rand();
              i = (i/7) % 36;   /* generate pseudo-random number between 1 and 36 */
              if (bits[i] == 0){
                rf[x][y] = i+28;   /* fill matrix entry with bit numbers 32 thru 63*/
                if (i== 0) rf[x][y]=-4;   /* if i==0, then CB4, designated as a -4  */
15              if (i== 1) rf[x][y]=-2;   /* if i==1, then CB6, designated as a -2  */
                if (i== 2) rf[x][y]=-5;   /* if i==2, then CB3, designated as a -5  */
                if (i== 3) rf[x][y]=-7;   /* if i==3, then CB1, designated as a -7  */
      /* The next five lines replace (move comments) the previous 5 lines when
         running the program for the lower-order 32 data bits and 4 other checkbits */
20    /*        rf[x][y] = i-4;   */   /* fill matrix entry with bit numbers 0 thru 31*/
      /*        if (i== 0) rf[x][y]=-8; */   /* if i==0, then CB0, designated as a -8  */
      /*        if (i== 1) rf[x][y]=-3; */   /* if i==0, then CB5, designated as a -3  */
      /*        if (i== 2) rf[x][y]=-6; */   /* if i==0, then CB2, designated as a -6  */
      /*        if (i== 3) rf[x][y]=-1; */   /* if i==0, then CB7, designated as a -1  */
25              bits[i] = 1;
                found = 1;
            }
          }
        }
30    }
```

28

```
        void shiftset(int ram[4][9]){
            int i;
            int w,x,y,z;
            int bs,cs;
5           char synmx[5][9];
            char res;
            int ramnib[] = { 0, 15, 18, 28, 99 };
            FILE *fpout;
            for (x=0; x<=8 ; x++)
10              for (y=0; y<=8; y++)
                    for (z=0; z<=8; z++) {
            /*          printf("%2d %2d %2d \b\b\b\b\b\b\b\b\b",x,y,z);   optional print output*/
                        res = 't';
                        /* check for all 4 failing: four-bit error in one module XXXX */
15                      for (w=0;( (w<=8)&((res=='t') | (res=='m')) ); w++) {
                            ramnib[0] = ram[0][w];
                            if (x+w <9)
                                ramnib[1] = ram[1][x+w];
                            else
20                              ramnib[1] = ram[1][x+w-9];
                            if (y+w <9)
                                ramnib[2] = ram[2][y+w];
                            else
                                ramnib[2] = ram[2][y+w-9];
25                          if (z+w <9)
                                ramnib[3] = ram[3][z+w];
                            else
                                ramnib[3] = ram[3][z+w-9];
                            ramnib[4] = 99;
30                          res = genedc(ramnib);
```

```
                                29
           synmx[0][w] = res;
         }
         tries++;
         if (w==9) {
 5          /* level one pass all four    */
            /* check combinations of three */
            /* set of three 012 : three-bit error in one 4-bit module XXX0    */
            bs=cs=0;
            for (w=0; w<=8; w++) {
10             ramnib[0] = ram[0][w];
               if (x+w <9)
                  ramnib[1] = ram[1][x+w];
               else
                  ramnib[1] = ram[1][x+w-9];
15             if (y+w <9)
                  ramnib[2] = ram[2][y+w];
               else
                  ramnib[2] = ram[2][y+w-9];
               ramnib[3] = 99;
20             synmx[1][w] = genedc(ramnib);
               if ( synmx[1][w] == 'b') bs++;
               if ( synmx[1][w] == 'c') cs++;
            }
            /* set of three 013    : three-bit error in one 4-bit module XX0X    */
25          for (w=0; w<=8; w++) {
               ramnib[0] = ram[0][w];
               if (x+w <9)
                  ramnib[1] = ram[1][x+w];
               else
30                ramnib[1] = ram[1][x+w-9];
```

```
              if (z+w <9)
                 ramnib[2] = ram[3][z+w];
              else
                 ramnib[2] = ram[3][z+w-9];
              ramnib[3] = 99;
              synmx[2][w] = genedc(ramnib);
              if ( synmx[2][w] == 'b') bs++;
              if ( synmx[2][w] == 'c') cs++;
           }
           /* set of three 023     : three-bit error in one 4-bit module X0XX */
           for (w=0; w<=8; w++) {
              ramnib[0] = ram[0][w];
              if (y+w <9)
                 ramnib[1] = ram[2][y+w];
              else
                 ramnib[1] = ram[2][y+w-9];
              if (z+w <9)
                 ramnib[2] = ram[3][z+w];
              else
                 ramnib[2] = ram[3][z+w-9];
              ramnib[3] = 99;
              synmx[3][w] = genedc(ramnib);
              if ( synmx[3][w] == 'b') bs++;
              if ( synmx[3][w] == 'c') cs++;
           }
           /* set of three 123     : three-bit error in one 4-bit module 0XXX */
           for (w=0; w<=8; w++) {
              if (x+w <9)
                 ramnib[0] = ram[1][x+w];
              else
```

31
```
            ramnib[0] = ram[1][x+w-9];
        if (y+w <9)
            ramnib[1] = ram[2][y+w];
        else
            ramnib[1] = ram[2][y+w-9];
        if (z+w <9)
            ramnib[2] = ram[3][z+w];
        else
            ramnib[2] = ram[3][z+w-9];
        ramnib[3] = 99;
        synmx[4][w] = genedc(ramnib);
        if ( synmx[4][w] == 'b') bs++;
        if ( synmx[4][w] == 'c') cs++;
    }
    if ( (cs+bs) <= mincb ){     /*if new minimum number of erroneous
                            results is at least as good as previous minimum,
                            then output result bit-connection order */
        fpout = fopen("upresults","a");
        fprintf(fpout,"\n");
        for (w=0; w<=8; w++) {
            fprintf(fpout,"%2d ",ram[0][w]);
        }
        fprintf(fpout,"\n");
        for (w=0; w<=8; w++) {
            if (x+w<9)
                fprintf(fpout,"%2d ",ram[1][x+w]);
            else
                fprintf(fpout,"%2d ",ram[1][x+w-9]);
        }
        fprintf(fpout,"\n");
```

32

```
        for (w=0; w<=8; w++) {
          if (y+w<9)
                fprintf(fpout,"%2d ",ram[2][y+w]);
          else
                fprintf(fpout,"%2d ",ram[2][y+w-9]);
        }
        fprintf(fpout,"\n");
        for (w=0; w<=8; w++) {
          if (z+w<9)
                fprintf(fpout,"%2d ",ram[3][z+w]);
          else
                fprintf(fpout,"%2d ",ram[3][z+w-9]);
        }
        fprintf(fpout,"\n");
        for (i=0; i<5; i++){
          for (w=0; w<=8; w++)
            fprintf(fpout,"%c  ",synmx[i][w]);
            fprintf(fpout,"\n");
        }
        fprintf(fpout," %d b's and %d c's ",bs,cs);
        fprintf(fpout," shifted %2d %2d %2d \n ",x,y,z);
        mincb = cs+bs;
        fclose(fpout);
        printf("New Minimum %d after %d tries \n",mincb,tries);
      }
    } /* end of if pass all four */
  } /* end of nested shifting for loops */
} /* End of Table 1 listing of exemplary program 510 */
```

In one embodiment, computer system 100 causes memory array 270 to be sequentially read, corrected, and rewritten during otherwise unused cycles, in order that single-bit errors (which may "spontaneously" appear from time-to-time from various causes) are detected and corrected. In one such embodiment, a pointer is maintained, and sequenced through each successive location of memory array 270 under control of access arbiter 218, in order to correct all single-bit soft errors (a soft error is one which can be corrected by overwriting the location with the correct data). This can help prevent the accumulation of two errors in one data word which is uncorrectable. Once all (or substantially all) locations have been checked and corrected, the process starts over again. This repeated operation, called 'scrubbing', allows the correction of certain single-bit errors in a data word before a second error in the same data word makes correction impossible (in the embodiment shown, SBEC/DBED chip circuit 300 detects and corrects all single-bit errors, but double-bit errors are only detectable, not correctable).

It is to be understood that the above description is intended to be illustrative, and not restrictive. Many other embodiments will be apparent to those of skill in the art upon reviewing the above description, including the use of corresponding methods on n-bit-wide memory chips, where n is any number greater than two. The scope of the invention should, therefore, be determined with reference to the appended claims, along with the full scope of equivalents to which such claims are entitled.

What is claimed is:

1. A computer system for improved detection of multiple-bit errors which occur within a single memory circuit, the computer system comprising:

a main computer;

a memory, the memory comprising a plurality of memory circuits, at least one of the plurality of memory circuits having a data interface more than two bits wide; and a multiple-bit-error-detect (MBED) circuit, wherein bits from the plurality of memory circuits are coupled to the MBED circuit in an order which causes the MBED circuit to preferentially detect multiple-bit errors which occur on the data interface of any single one of the plurality of memory circuits.

2. The computer system according to claim 1, wherein the MBED circuit is a single-bit-error-correct, two-bit-error-detect (SBEC/DBED) circuit, wherein each of a plurality of the memory circuits have a data interface which is four-bits wide, and wherein bits from the memory interface are coupled to the MBED circuit in an order which causes the MBED circuit to also detect all three-bit and four-bit errors which occur at one time within any single one of the plurality of four-bit-wide memory circuits.

3. The computer system according to claim 1, wherein the order that the bits from the plurality of memory circuits are coupled to the MBED circuit is determined by running a test program on a test computer to successively test various orders of coupling bits to the MBED circuit.

4. The computer system according to claim 3, wherein the test program comprises a data structure indicative of which error code (EC) bits are affected by each memory bit of the memory circuits.

5. The computer system according to claim 2, wherein the test program comprises a data structure indicative of error syndromes and related error indications.

6. The computer system according to claim 5, wherein the test program comprises a data structure indicative of which error code (EC) bits are affected by each memory bit of the memory circuits.

7. A memory error-detection subsystem for improved detection of multiple-bit errors in a computer system, the computer system having a memory, the memory having a plurality of memory circuits, at least one of the plurality of memory circuits having a three-bit wide or a four-bit-wide data interface, the memory subsystem capable of detecting one-, two-, three-, and four-bit errors within a single memory circuit, the memory subsystem comprising:

a memory interface to the memory circuits; and a multiple-bit-error-detect (MBED) circuit coupled to the main computer and the memory interface, wherein bits from the plurality of memory circuits are coupled to the MBED circuit in an order which causes the MBED circuit to preferentially detect multiple-bit errors which occur on the data interface of any single one of the plurality of memory circuits.

8. The memory subsystem according to claim 7, wherein the MBED circuit is a single-bit-error-correct, two-bit-error-detect (SBEC/DBED) circuit, wherein each of a plurality of the memory circuits have a data interface which is four-bits wide, and wherein bits from the memory interface are coupled to the MBED circuit in an order which causes the MBED circuit to also detect all three-bit and four-bit errors which occur at one time within any single one of the plurality of four-bit-wide memory circuits.

9. The memory subsystem according to claim 8, wherein bits from the memory interface are coupled to the MBED circuit in the following order:

a 1st memory circuit coupled to MBED bits MD0, MD15, MD19, and CB7;

a 2nd memory circuit coupled to MBED bits MD32, MD44, MD56, and MD59;

a 3rd memory circuit coupled to MBED bits MD1, MD4, MD22, and MD24;

a 4th memory circuit coupled to MBED bits MD33, MD51, MD55, and CB6;

a 5th memory circuit coupled to MBED bits MD2, MD17, MD26, and CB5;

a 6th memory circuit coupled to MBED bits MD34, MD53, MD57, and CB1;

a 7th memory circuit coupled to MBED bits MD3, MD11, MD16, and MD23;

an 8th memory circuit coupled to MBED bits MD35, MD37, MD46, and MD61;

a 9th memory circuit coupled to MBED bits MD5, MD9, MD18, and MD30;

a 10th memory circuit coupled to MBED bits MD36, MD38, MD62, and CB3;

a 11th memory circuit coupled to MBED bits MD6, MD13, MD20, and CB0;

a 12th memory circuit coupled to MBED bits MD39, MD48, MD52, and MD54;

a 13th memory circuit coupled to MBED bits MD7, MD25, MD27, and MD31;

a 14th memory circuit coupled to MBED bits MD40, MD41, MD43, and MD63;

a 15th memory circuit coupled to MBED bits MD8, MD21, MD28, and CB2;

a 16th memory circuit coupled to MBED bits MD42, MD45, MD47, and MD60;

a 17th memory circuit coupled to MBED bits MD10, MD12, MD14, and MD29; and an 18th memory circuit coupled to MBED bits MD49, MD50, MD58, and CB4.

10. The memory subsystem according to claim 7, wherein the order that the bits from the plurality of memory circuits are coupled to the MBED circuit is determined by running a test program on a test computer to successively test various orders of coupling bits to the MBED circuit.

11. The memory subsystem according to claim 10, wherein the test program comprises a data structure indicative of which error code (EC) bits are affected by each memory bit of the memory circuits.

12. The memory subsystem according to claim 10, wherein the test program comprises a data structure indicative of error syndromes and related error indications.

13. The memory subsystem according to claim 12, wherein the test program comprises a data structure indicative of which error code (EC) bits are affected by each memory bit of the memory circuits.

14. A method for designing a memory system for a computer system, the memory system for improved detection of a predetermined set of multiple-bit errors, the memory system having an error-detection circuit capable of detecting multiple-bit errors, and a memory array, the memory array having a plurality of memory circuits including a first and a second memory circuit each having a data interface which is more than two bits wide and each connected to the error-detection circuit, the method comprising the steps of:
  a) providing an initial bit-connection order between the plurality of memory circuits and the error-detection circuit;
  b) testing each of the predetermined set of possible multi-bit error conditions;
  c) determining whether the error-detection circuit provides (1) an erroneous no-error/single-bit-error indication or (2) a non-erroneous multiple-bit-error indication for each one of the predetermined set of possible multi-bit error conditions; and
  d) based on a number of erroneous indications or non-erroneous indications determined in step c), either:
    re-ordering the bit-connection order and reexecuting step b), or
    providing the bit-connection order as an output.

15. The method according to claim 14, wherein the step of providing an initial bit-connection order comprises the step of assigning at least one bit connection based in a pseudo-random number.

16. The method according to claim 14, wherein the step of testing comprises the step of exclusive-ORing a first data pattern from an error-code data structure with a second data pattern from the error-code data structure and generating a test syndrome.

17. The method according to claim 14, wherein the step of determining whether the error-detection circuit provides (1) an erroneous no-error/single-bit-error indication or (2) a non-erroneous multiple-bit-error indication comprises the step of performing a table lookup in a syndrome data structure.

18. The method according to claim 14, wherein the step of re-ordering comprises the step of shifting at least one bit connection from the first memory circuit to the second memory circuit.

19. A method for designing a memory system for a computer system capable of detecting multiple-bit errors within each of a plurality of single memory circuits, the computer system having an error-detection circuit capable of detecting multiple-bit errors and generating a plurality of error syndromes, and a memory, the memory having a plurality of memory circuits including a first and a second memory circuit each having a data interface which is more than two bits wide and each connected to the error detection circuit, the method comprising the steps of:
  a) providing a syndrome data structure distinguishing whether the error-detection circuit provides (1) no-error/single-bit-error indication from (2) a multiple-bit-error indication, as a result of each of the error syndromes;
  b) providing an error code (EC) data structure indicative of which EC bits are affected by each memory bit of the memory circuits;
  c) providing an initial bit-connection order between the plurality of memory circuits and the error-detection circuit;
  d) using a computer program which uses the bit connection order, the syndrome data structure, and the EC data structure, determining whether a first error, having more than two bits wrong within the first memory circuit, would be detected with a multiple-bit-error indication and whether a second error, having more than two bits wrong within the second memory circuit, would be detected with a multiple-bit-error indication; and
  e) if either the first error or the second error or both are not detected with a multiple-bit-error indication, then re-ordering the bit-connection order and reexecuting step d), otherwise outputting the bit-connection order.

* * * * *

UNITED STATES PATENT AND TRADEMARK OFFICE
CERTIFICATE OF CORRECTION

PATENT NO. : 5,745,508
DATED : Apr. 28, 1998
INVENTOR(S) : Thomas R. Prohofsky

It is certified that error appears in the above-identified patent and that said Letters Patent is hereby corrected as shown below:

At the Abstract, line 2, please delete "circuits" and insert --circuit--.

At Col. 9, line 20, please delete "10A & 10B" and insert --10A, 10B & 10C--.

At Col. 39, line 57, please delete "3" and insert --5--.

At Col. 39, line 61, please delete "2" and insert --3--.

At Col. 39, line 64, please delete "5" and insert --3--.

Signed and Sealed this

Fourteenth Day of March, 2000

Attest:

Attesting Officer

Q. TODD DICKINSON

Commissioner of Patents and Trademarks